(12) United States Patent
Nagata

(10) Patent No.: US 10,134,887 B2
(45) Date of Patent: *Nov. 20, 2018

(54) SEMICONDUCTOR DEVICE AND MANUFACTURING METHOD THEREOF

(71) Applicant: Renesas Electronics Corporation, Koutou-ku, Tokyo (JP)

(72) Inventor: Nao Nagata, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/715,087

(22) Filed: Sep. 25, 2017

(65) Prior Publication Data

US 2018/0012984 A1 Jan. 11, 2018

Related U.S. Application Data

(63) Continuation of application No. 15/145,712, filed on May 3, 2016, now Pat. No. 9,780,203.

(30) Foreign Application Priority Data

Jul. 2, 2015 (JP) ................................. 2015-133298

(51) Int. Cl.
| | | |
|---|---|---|
| *H01L 29/739* | (2006.01) | |
| *H01L 29/06* | (2006.01) | |
| *H01L 29/10* | (2006.01) | |
| *H01L 29/66* | (2006.01) | |
| *H01L 29/40* | (2006.01) | |
| *H01L 29/423* | (2006.01) | |
| *H03K 17/12* | (2006.01) | |

(52) U.S. Cl.
CPC ...... *H01L 29/7397* (2013.01); *H01L 29/0619* (2013.01); *H01L 29/0696* (2013.01); *H01L 29/1095* (2013.01); *H01L 29/66348* (2013.01); *H01L 29/402* (2013.01); *H01L 29/4238* (2013.01); *H03K 17/127* (2013.01)

(58) Field of Classification Search
CPC ............ H01L 29/7397; H01L 29/0696; H01L 29/0619; H01L 29/1095; H01L 29/66348; H01L 29/402; H01L 29/4238; H03K 17/127

See application file for complete search history.

(56) References Cited

U.S. PATENT DOCUMENTS

| | | |
|---|---|---|
| 2006/0163649 A1 | 7/2006 | Otsuki |
| 2012/0292662 A1 | 11/2012 | Matsuura et al. |
| 2013/0175574 A1 | 7/2013 | Matsuura |

FOREIGN PATENT DOCUMENTS

| | | |
|---|---|---|
| JP | 2006-210547 A | 8/2006 |
| JP | 2012-256839 A | 12/2012 |
| JP | 2013-140885 A | 7/2013 |

*Primary Examiner* — Latanya N Crawford
(74) *Attorney, Agent, or Firm* — Shapiro, Gabor and Rosenberger, PLLC

(57) ABSTRACT

A semiconductor device includes a first trench gate electrode and a second trench gate electrode which are electrically connected to a gate electrode, and a third trench gate electrode and a fourth trench gate electrode which are electrically connected to an emitter electrode. A plurality of $p^+$ type semiconductor regions are formed in a part of a semiconductor layer between the first trench gate electrode and the second trench gate electrode. The plurality of $p^+$ type semiconductor regions are arranged to be spaced apart from each other along an extending direction of the first trench gate electrode when seen in a plan view.

9 Claims, 26 Drawing Sheets

SEMICONDUCTOR DEVICE AND MANUFACTURING METHOD THEREOF

CROSS-REFERENCE TO RELATED APPLICATION

The present application claims priority from Japanese Patent Application No. 2015-133298 filed on Jul. 2, 2015, the content of which is hereby incorporated by reference into this application.

TECHNICAL FIELD OF THE INVENTION

The present invention relates to a semiconductor device, and can be preferably applied to, for example, a semiconductor device provided with an insulated gate bipolar transistor (IGBT).

BACKGROUND OF THE INVENTION

A trench gate IGBT has been widely used as an IGBT with low on-resistance, and an injection-enhanced (IE) IGBT in which an active cell region connected to an emitter electrode and an inactive cell region including a floating region are alternately arranged in a cell formation region, thereby enabling the use of injection enhancement (IE) effect, has been developed. The IE effect is to increase the concentration of charge stored in a drift region by making it difficult to discharge holes from an emitter electrode side when the IGBT is in an on-state.

Japanese Patent Application Laid-Open Publication No. 2012-256839 (Patent Document 1) discloses a technique relating to an IE trench gate IGBT in which each linear unit cell region provided in a cell formation region includes a linear active cell region and linear inactive cell regions provided to sandwich the linear active cell region from both sides thereof.

Japanese Patent Application Laid-Open Publication No. 2013-140885 (Patent Document 2) discloses a technique relating to an IE trench gate IGBT in which each linear unit cell region provided in a cell formation region includes first and second linear unit cell regions, the first linear unit cell region includes a linear active cell region, and the second linear unit cell region includes a linear hole collector cell region.

Japanese Patent Application Laid-Open Publication No. 2006-210547 (Patent Document 3) discloses a technique relating to an insulated gate semiconductor device including a second semiconductor layer of a second conductivity type provided on a first semiconductor layer of a first conductivity type, a plurality of stripe-shaped trenches formed on a surface of the second semiconductor layer, and a plurality of third semiconductor regions of the first conductivity type selectively formed in a longitudinal direction between the trenches.

SUMMARY OF THE INVENTION

For example, a semiconductor device in which an IGBT including a gate-gate (GG) type active cell region and an emitter-emitter (EE) type inactive cell region (non-active cell region) like the IE trench gate IGBT disclosed in the Patent Document 2 described above is provided as an IE trench gate IGBT has been known.

Since the EE-type inactive cell region is provided, carriers stored in the on-state are easily discharged at the time of turning off. However, the IE effect is likely to be suppressed in the case of providing the EE-type inactive cell region as compared to the case in which the EE-type inactive cell region is not provided. Thus, it is desirable to further improve the performance of the semiconductor device such as the IE effect in the semiconductor device in which the IGBT including the GG-type active cell region and the EE-type inactive cell region is provided.

Other problems and novel features will be apparent from description of the present specification and the attached drawings.

According to an embodiment, a semiconductor device includes: a first trench electrode; a second trench electrode which is arranged to be spaced apart from the first trench electrode; a third trench electrode which is arranged on an opposite side of the first trench electrode with the second trench electrode interposed therebetween; and a fourth trench electrode which is arranged on an opposite side of the second trench electrode with the third trench electrode interposed therebetween. The first trench electrode and the second trench electrode are connected to a gate electrode, and the third trench electrode and the fourth trench electrode are connected to an emitter electrode. A plurality of $p^+$ type semiconductor regions are formed in a semiconductor layer between the first trench electrode and the second trench electrode, and a $p^+$ type semiconductor region is continuously formed in a semiconductor layer between the third trench electrode and the fourth trench electrode. The plurality of $p^+$ type semiconductor regions are arranged to be spaced apart from each other along an extending direction of the first trench electrode between the first trench electrode and the second trench electrode when seen in a plan view.

In addition, according to another embodiment, in a manufacturing method of a semiconductor device, a first trench electrode, a second trench electrode which is arranged to be spaced apart from the first trench electrode, a third trench electrode which is arranged on an opposite side of the first trench electrode with the second trench electrode interposed therebetween, and a fourth trench electrode which is arranged on an opposite side of the second trench electrode with the third trench electrode interposed therebetween are formed. The first trench electrode and the second trench electrode are connected to a gate electrode, and the third trench electrode and the fourth trench electrode are connected to an emitter electrode. Next, a plurality of $p^+$ type semiconductor regions are formed in a semiconductor layer between the first trench electrode and the second trench electrode, and a $p^+$ type semiconductor region is continuously formed in a semiconductor layer between the third trench electrode and the fourth trench electrode. The plurality of $p^+$ type semiconductor regions are arranged to be spaced apart from each other along an extending direction of the first trench electrode between the first trench electrode and the second trench electrode when seen in a plan view.

According to an embodiment, it is possible to improve the performance of the semiconductor device.

BRIEF DESCRIPTIONS OF THE DRAWINGS

DESCRIPTIONS OF THE PREFERRED EMBODIMENTS

Figure 1:
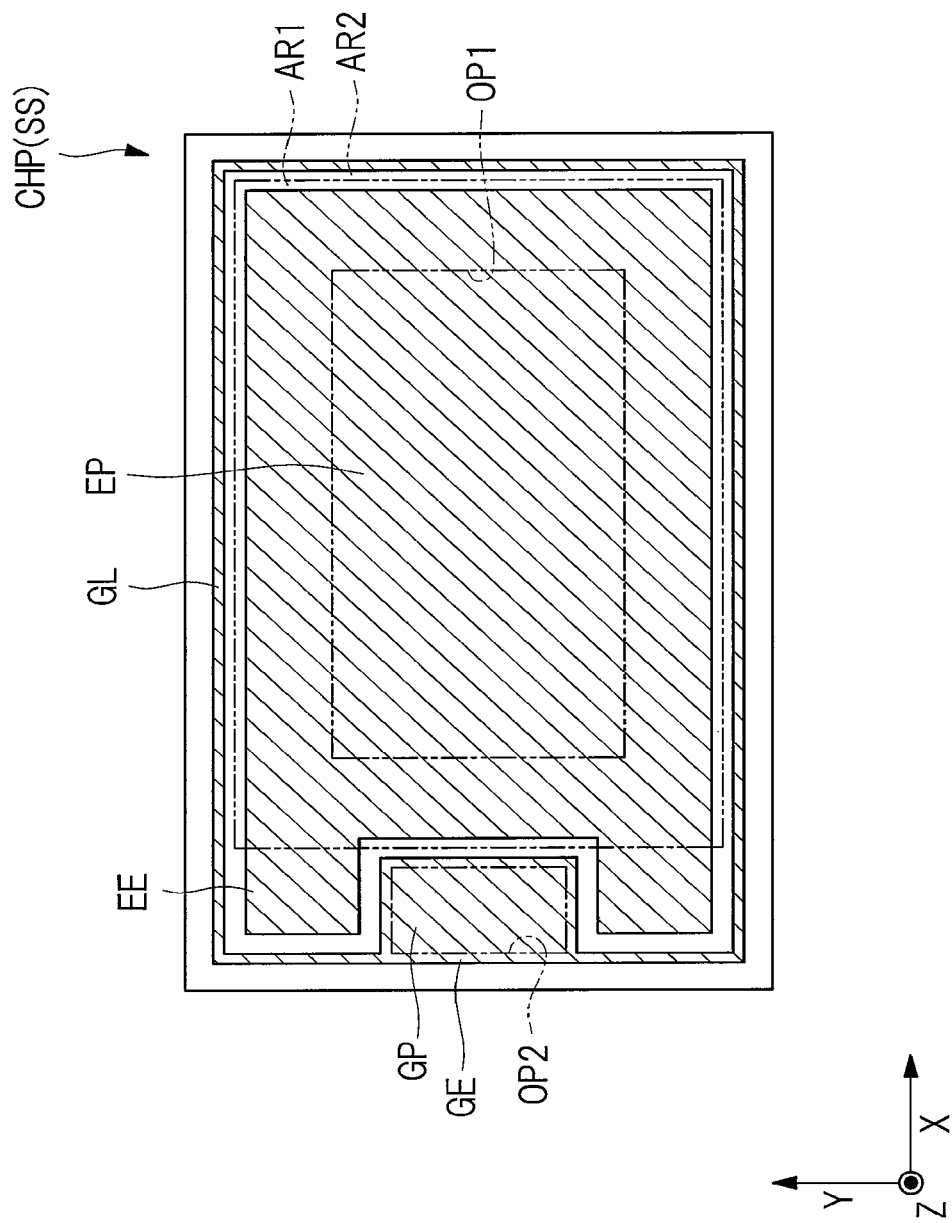
FIG. 1 is a plan view of a semiconductor chip serving as a semiconductor device of the first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, the components (including element steps) are not always indispensable unless otherwise stated or except the case where the components are apparently indispensable in principle. Similarly, in the embodiments described below, when the shape of the components, positional relation thereof and the like are mentioned, the substantially approximate and similar shapes and the like are included therein unless otherwise stated or except the case where it is conceivable that they are apparently excluded in principle. The same goes for the numerical values and ranges described above.

Hereinafter, typical embodiments will be described in detail based on the drawings. Note that the components having the same function are denoted by the same reference characters throughout the drawings for describing the embodiments, and the repetitive description thereof will be omitted. In addition, the description of the same or similar portions is not repeated in principle unless particularly required in the following embodiments.

Further, in the drawings used in the following embodiments, hatching is omitted in some cases even in a cross-sectional view so as to make the drawings easy to see. Also, hatching is used in some cases even in a plan view so as to make the drawings easy to see.

First Embodiment

Hereinafter, a semiconductor device according to the first embodiment will be described in detail with reference to the drawings.

The semiconductor device according to the first embodiment is a semiconductor device provided with an IGBT including a gate-gate (GG) type active cell region and an emitter-emitter (EE) type inactive cell region (non-active cell region). Note that the IGBT including the GG-type active cell region means that each of two trench gate electrodes arranged to be spaced apart from each other in an active cell region is electrically connected to a gate electrode. In addition, the IGBT including the EE-type inactive cell region means that each of two trench gate electrodes arranged to be spaced apart from each other in an inactive cell region is electrically connected to an emitter electrode.

<Configuration of Semiconductor Device>

First, a configuration of a semiconductor chip serving as the semiconductor device according to the first embodiment will be described.

Figure 2:
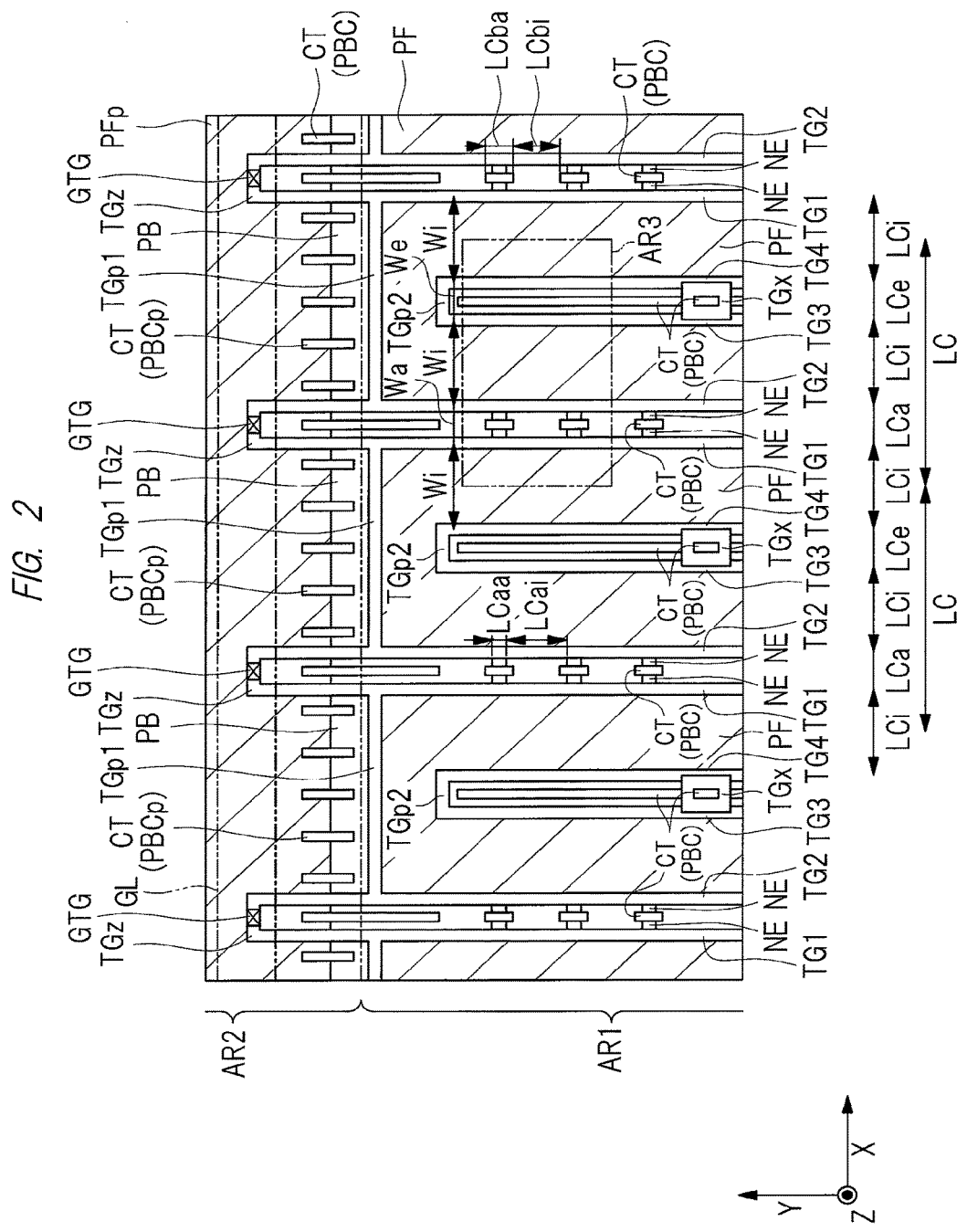
FIG. 2 is a plan view showing a main part of the semiconductor device according to the first embodiment.
Figure 3:
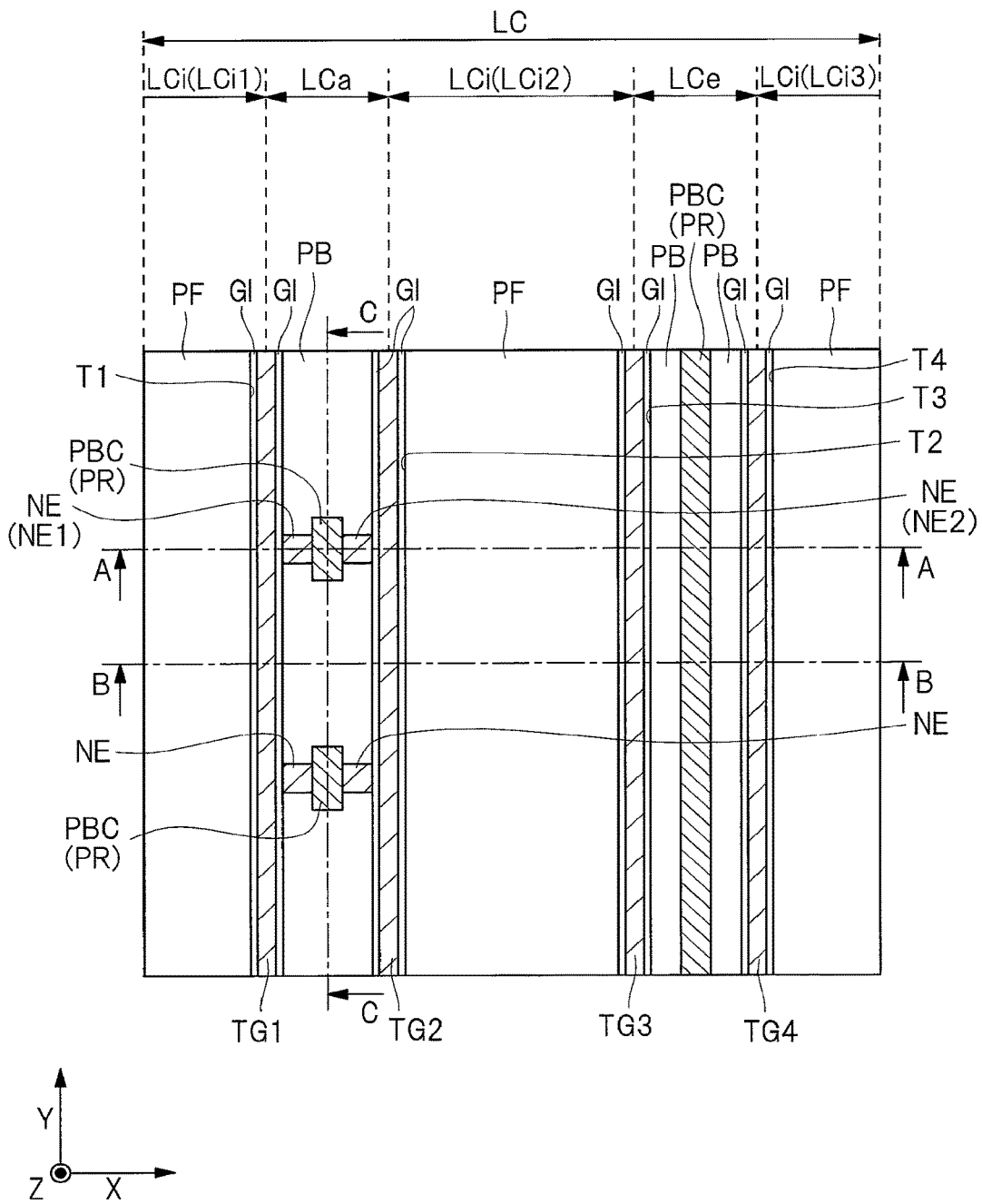
FIG. 3 is a plan view showing a main part of the semiconductor device according to the first embodiment.
Figure 4:
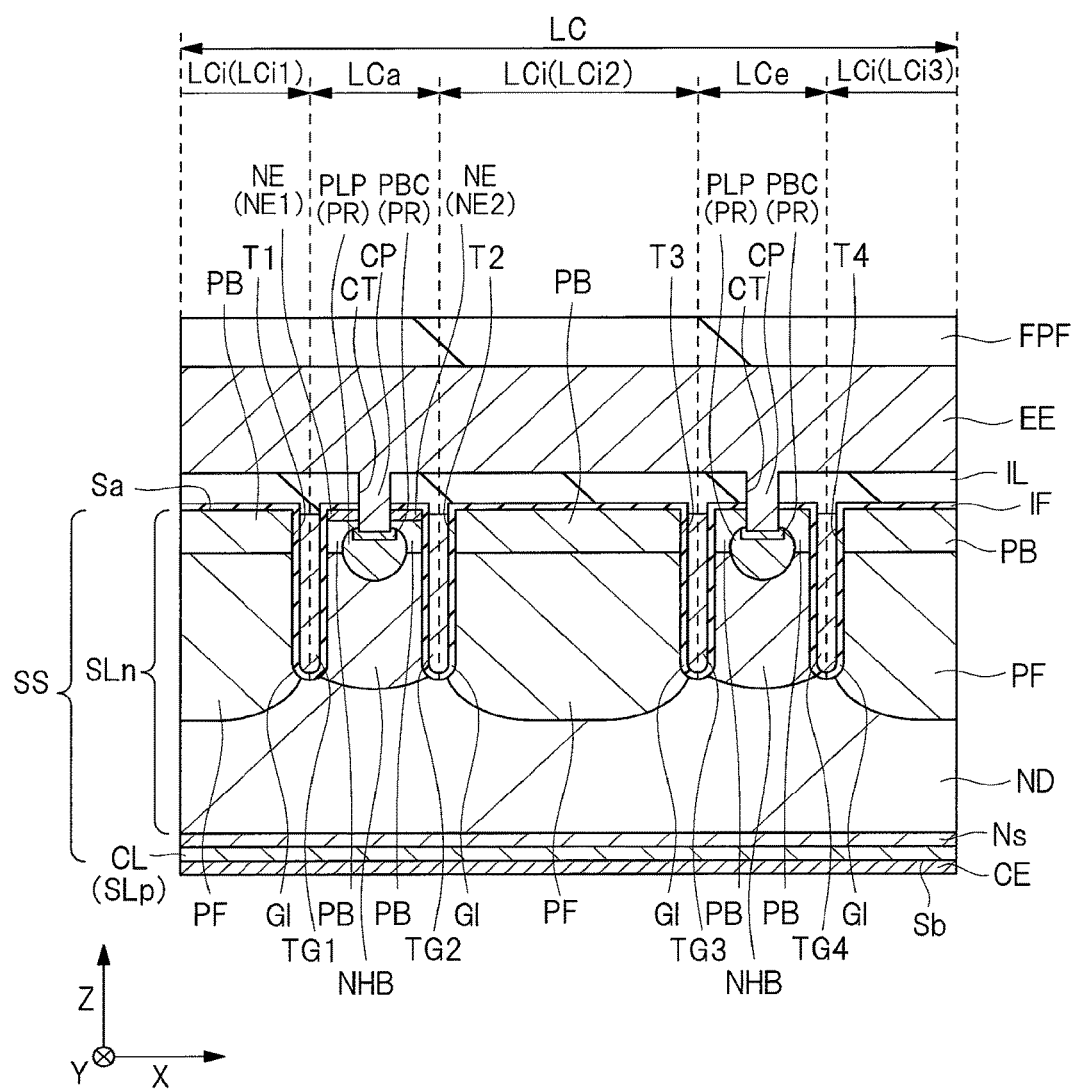
FIG. 4 is a cross-sectional view showing a main part of the semiconductor device according to the first embodiment.
Figure 5:
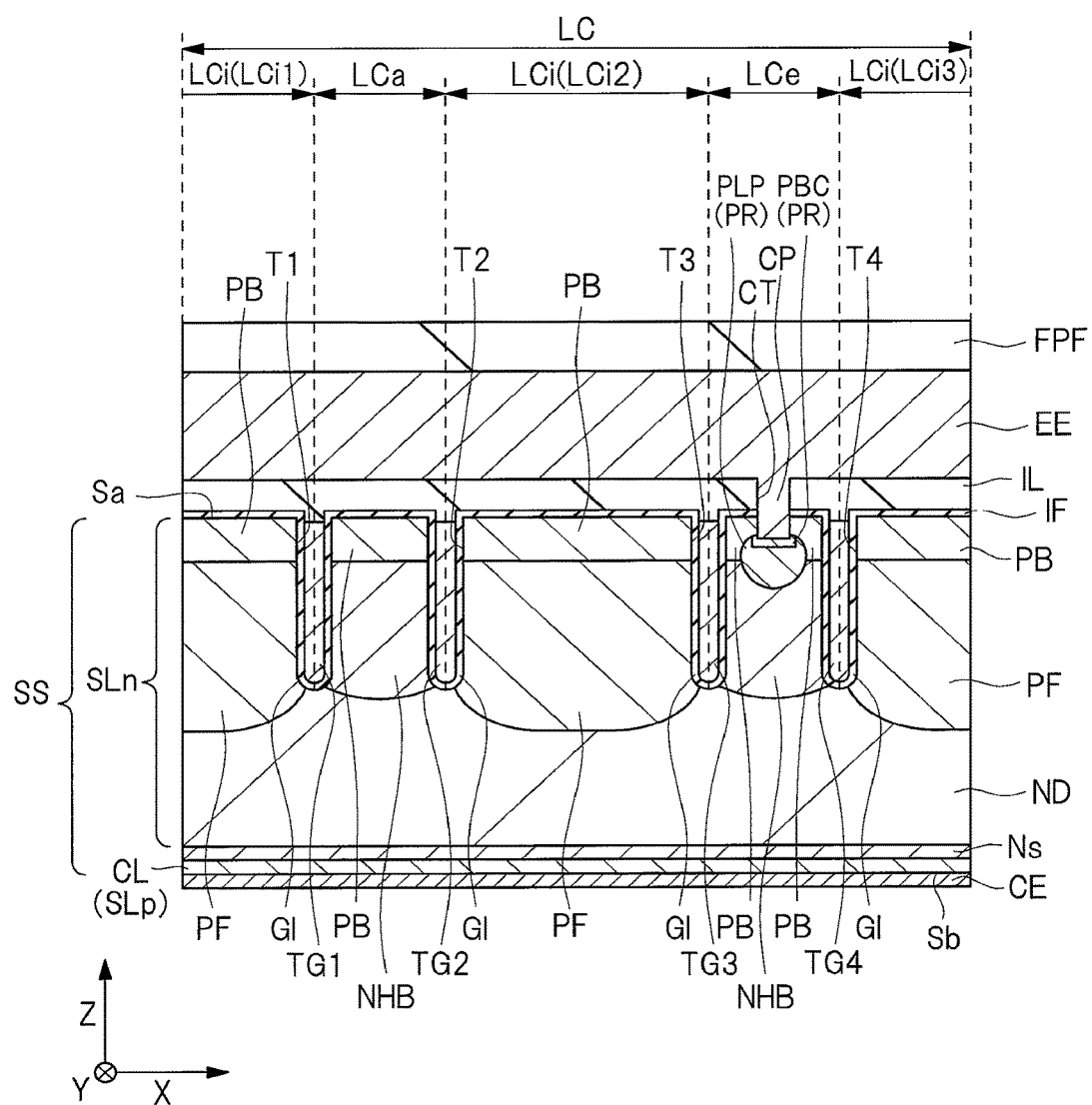
FIG. 5 is a cross-sectional view showing a main part of the semiconductor device according to the first embodiment.
Figure 6:
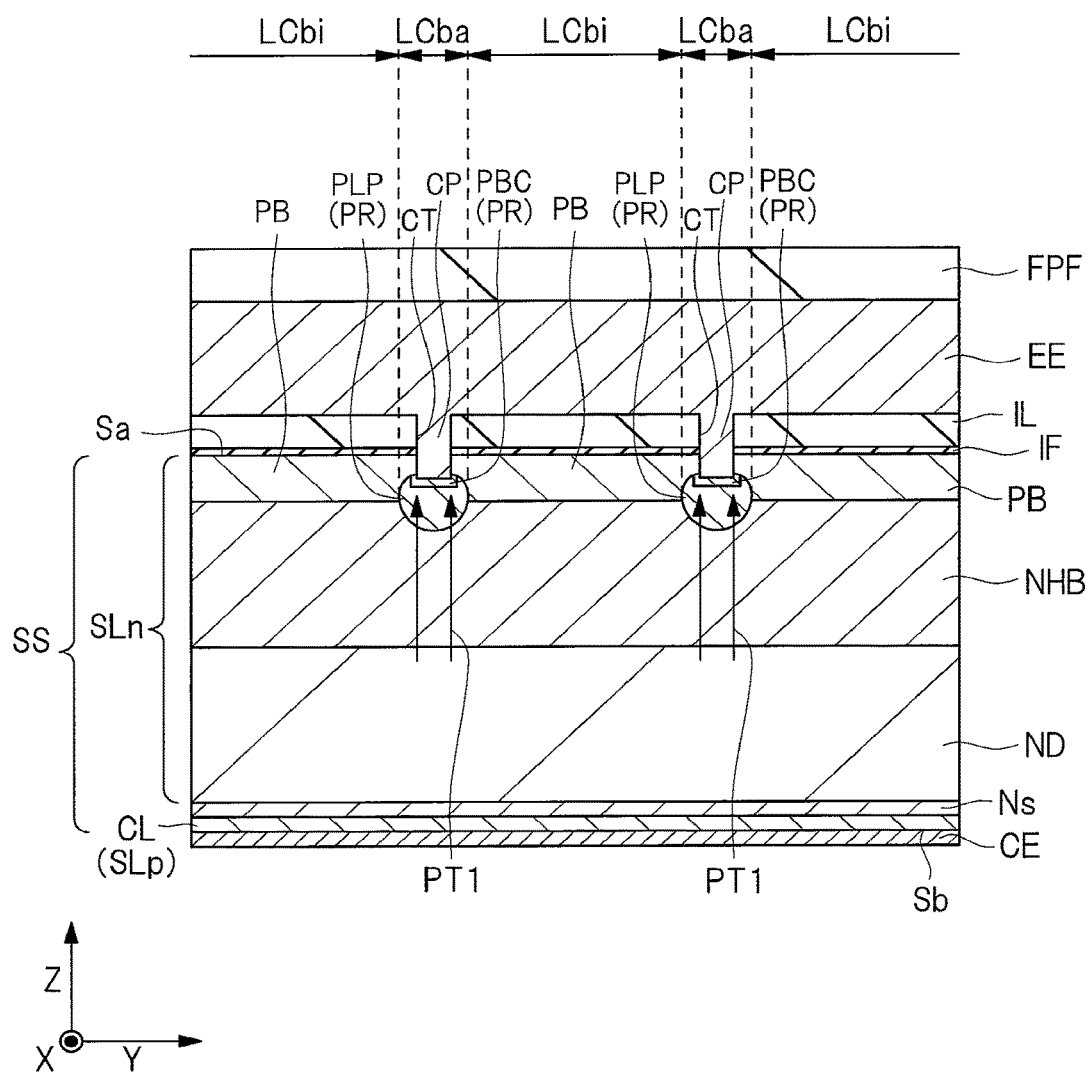
FIG. 6 is a cross-sectional view showing a main part of the semiconductor device according to the first embodiment.

FIG. 1 is a plan view of the semiconductor chip serving as the semiconductor device according to the first embodiment. FIGS. 2 and 3 are plan views showing main parts of the semiconductor device according to the first embodiment. FIGS. 4 to 6 are cross-sectional views showing main parts of the semiconductor device according to the first embodiment. FIG. 3 illustrates a region AR3 surrounded by the two-dot chain line of FIG. 2 in an enlarged manner. In addition, FIG. 4 is the cross-sectional view taken along a line A-A of FIG. 3, FIG. 5 is the cross-sectional view taken along a line B-B of FIG. 3, and FIG. 6 is the cross-sectional view taken along a line C-C of FIG. 3.

Note that FIG. 1 illustrates a state seen through an insulating film FPF (see FIG. 4) in order to simplify the understanding, and illustrates each outer circumference of a cell formation region AR1, an emitter pad EP and a gate pad GP by two-dot chain lines. In addition, FIG. 2 illustrates a state seen through the insulating film FPF, a gate wiring GL, an emitter electrode EE, an interlayer insulating film IL and a part of a p type body region PB (see FIG. 4) formed on a p type floating region PF in order to simplify the understanding, and illustrates each outer circumference of the cell formation region AR1 and the gate wiring GL by two-dot chain lines.

As illustrated in FIG. 1, a semiconductor chip CHP serving as the semiconductor device according to the first embodiment includes a semiconductor substrate SS. The semiconductor substrate SS has an upper surface Sa (see FIG. 4) as one main surface and a lower surface Sb (see FIG. 4) as the other main surface on the opposite side of the upper surface. In addition, the semiconductor substrate SS includes the cell formation region AR1 which is a partial region of the upper surface Sa and a gate wiring lead-out region AR2 which is another partial region of the upper surface Sa. The gate wiring lead-out region AR2 is provided on, for example, an outer circumference side of the semiconductor substrate SS relative to the cell formation region AR1.

The emitter electrode EE is provided in the cell formation region AR1. The center portion of the emitter electrode EE serves as an emitter pad EP to connect a bonding wire or the like. The emitter pad EP is formed of a part of the emitter electrode EE exposed from an opening portion OP1 formed in the insulating film FPF (see FIG. 4) formed to cover the emitter electrode EE. The emitter electrode EE is made of, for example, a metal film containing aluminum as a major component.

The gate wiring GL and a gate electrode GE are provided in the gate wiring lead-out region AR2. For example, the gate wiring GL is provided on the outer circumference side of the semiconductor substrate SS relative to the emitter electrode EE. The gate wiring GL is connected to the gate electrode GE. The center portion of the gate electrode GE serves as a gate pad GP to connect a bonding wire or the like. The gate pad GP is formed of a part of the gate electrode GE exposed from an opening portion OP2 formed in the insulating film FPF (see FIG. 4) formed to cover the gate electrode GE. The gate wiring GL and the gate electrode GE are made of, for example, a metal film containing aluminum as a major component.

As illustrated in FIGS. 1 to 6, two directions which cross each other or preferably are orthogonal to each other on an upper surface of the semiconductor substrate SS are defined as an X-axis direction and a Y-axis direction, and a direction perpendicular to the upper surface of the semiconductor substrate SS, that is, the vertical direction is defined as a Z-axis direction. At this time, a plurality of unit cell regions LC are provided in the cell formation region AR1 as illustrated in FIG. 2. The plurality of unit cell regions LC extend in the Y-axis direction and are periodically arranged in the X-axis direction when seen in a plan view.

Note that the expression "when seen in a plan view" means a case seen from the direction perpendicular to the upper surface Sa of the semiconductor substrate SS in the specification of the present application.

Each of the unit cell regions LC includes an active cell region LCa serving as the GG-type active cell region, an inactive cell region LCe serving as the EE-type inactive cell region, and three inactive cell regions LCi.

The first and second inactive cell regions LCi are arranged on both sides of the active cell region LCa interposed therebetween in the X-axis direction. The inactive cell region LCe is arranged on the opposite side of the active cell region LCa with the second inactive cell region LCi interposed therebetween in the X-axis direction. The third inactive cell region LCi is arranged on the opposite side of the second inactive cell region LCi with the inactive cell region LCe interposed therebetween in the X-axis direction. Each of the active cell region LCa, the inactive cell region LCe and the three inactive cell regions LCi extends in the Y-axis direction when seen in a plan view.

Preferably, a width Wa of the active cell region LCa is smaller than a width Wi of the inactive cell region LCi. In addition, a width We of the inactive cell region LCe is smaller than the width Wi of the inactive cell region LCi.

The two unit cell regions LC adjacent to each other in the X-axis direction share one inactive cell region LCi. Accordingly, the unit cell region LC includes a positive-side half portion LCi1 of the first inactive cell region LCi arranged to be adjacent on a negative side in the X-axis direction with respect to the active cell region LCa. Also, the unit cell region LC further includes a portion LCi2 which is the second inactive cell region LCi arranged between the active cell region LCa and the inactive cell region LCe. In addition, the unit cell region LC further includes a negative-side half portion LCi3 of the third inactive cell region LCi arranged to be adjacent on a positive side in the X-axis direction with respect to the inactive cell region LCe.

The active cell region LCa includes a trench gate electrode TG1 serving as a trench electrode arranged in a boundary surface between the active cell region LCa and the portion LCi1 of the inactive cell region LCi. In addition, the active cell region LCa includes a trench gate electrode TG2 serving as a trench electrode arranged in a boundary surface between the active cell region LCa and the portion LCi2 of the inactive cell region LCi. The trench gate electrodes TG1 and TG2 are electrically connected to the gate electrode GE.

Meanwhile, the inactive cell region LCe includes a trench gate electrode TG3 serving as a trench electrode arranged in a boundary surface between the inactive cell region LCe and the portion LCi2 of the inactive cell region LCi. In addition, the inactive cell region LCe includes a trench gate electrode TG4 serving as a trench electrode arranged in a boundary surface between the inactive cell region LCe and the portion LCi3 of the inactive cell region LCi.

In the active cell region LCa, a plurality of $n^+$ type emitter regions NE are formed on a part of the p type body region PB on aside close to the upper surface Sa of the semiconductor substrate SS. The p type body region PB is a semiconductor region of a p conductivity type, and the $n^+$ type emitter region NE is a semiconductor region of an n conductivity type different from the p conductivity type. In the active cell region LCa, the p type body region PB is continuously formed along the Y-axis direction when seen in a plan view. In the active cell region LCa, the plurality of $n^+$ type emitter regions NE are arranged to be spaced apart from each other along the Y-axis direction.

In the specification of the present application, a fact that the conductivity type of the semiconductor is the p type means that only a hole is a charge carrier or that either of an electron or a hole may be the charge carrier but the concentration of the holes is higher than the concentration of the electrons and the hole is a major charge carrier. In addition, in the specification of the present application, a fact that the conductivity type of the semiconductor is the n type means that only an electron is a charge carrier or that either of an electron or a hole may be the charge carrier but the concentration of the electrons is higher than the concentration of the holes and the electron is a major charge carrier.

In the active cell region LCa, a region in which the $n^+$ type emitter region NE is formed, that is, an active section LCaa and a region in which the $n^+$ type emitter region NE is not formed (p type body region PB), that is, an inactive section LCai are alternately arranged along the Y-axis direction.

In the inactive cell region LCe, the $n^+$ type emitter region NE is not formed on a part of the p type body region PB on a side close to the upper surface Sa of the semiconductor substrate SS. In the inactive cell region LCe, the p type body region PB is continuously formed along the Y-axis direction when seen in a plan view.

The p type floating region PF is provided in the inactive cell region LCi. An end portion of the p type floating region PF on a side close to the lower surface Sb is arranged close to the lower surface Sb in the Z-axis direction relative to respective end portions of trenches T1, T2, T3 and T4 on a side close to the lower surface Sb, in which the trench gate electrodes TG1, TG2, TG3 and TG4 are formed. In such a case, it is possible to secure the withstand voltage even when the width Wi of the inactive cell region LCi in the X-axis direction is larger than the width Wa of the active cell region LCa in the X-axis direction. In addition, it is possible to secure the withstand voltage even when the width Wi of the inactive cell region LCi in the X-axis direction is larger than the width We of the inactive cell region LCe in the X-axis direction.

In the example illustrated in FIG. 2, the width Wa of the active cell region LCa in the X-axis direction is set to be smaller than the width Wi of the inactive cell region LCi in the X-axis direction, and the width We of the inactive cell region LCe in the X-axis direction is set to be smaller than the width Wi of the inactive cell region LCi in the X-axis direction. In such a case, it is possible to further enhance the IE effect of the IGBT.

In a part of the gate wiring lead-out region AR2, for example, a p type floating region PFp is provided so as to surround the cell formation region AR1. In addition, the p type floating region PFp is electrically connected to the emitter electrode EE via a part of a $p^+$ type body contact region PBCp exposed to a bottom surface of a contact trench CT.

Further, the gate wiring GL is arranged in the gate wiring lead-out region AR2, and the trench gate electrodes TG1 and TG2 extend from the inside of the cell formation region AR1 toward the gate wiring GL. Then, end portions of the trench gate electrodes TG1 and TG2 adjacent in the X-axis direction are connected to each other via a trench gate electrode TGz in the gate wiring lead-out region AR2. The trench gate electrode TGz is arranged inside a region in which the gate wiring GL is arranged when seen in a plan view. Then, the trench gate electrode TGz is electrically connected to the gate wiring GL via a connection electrode GTG. Note that an end portion of the inactive cell region LCi on a side close to the gate wiring lead-out region AR2 is partitioned by an end trench gate electrode TGp1. The trench gate electrode TG1 and the trench gate electrode TG2 adjacent in the X-axis direction are electrically connected to each other also via the end trench gate electrode TGp1.

Also, end portions of the trench gate electrodes TG3 and TG4 adjacent in the X-axis direction are connected to each other via an end trench gate electrode TGp2. The trench gate electrode TG3 and the trench gate electrode TG4 are electrically connected to each other via an emitter connection portion TGx made of, for example, a polycrystalline silicon film formed in the same layer as the trench gate electrodes TG3 and TG4, in addition to the end trench gate electrode TGp2. Then, the emitter connection portion TGx is electrically connected to the emitter electrode EE via the contact trench CT formed in the emitter connection portion TGx. With such a structure, it is possible to improve the reliability in the electrical connection between the trench gate electrodes TG3 and TG4 and the emitter electrode EE.

In the first embodiment, a plurality of $p^+$ type semiconductor regions PR including a $p^+$ type body contact region PBC and a $p^+$ type latch-up prevention region PLP are provided in the active cell region LCa. In the active cell region LCa, each of the plurality of $p^+$ type semiconductor regions PR is formed in a part of a semiconductor layer SLn positioned between the trench T1 and the trench T2 and is in contact with the p type body region PB.

In the active cell region LCa, the plurality of $p^+$ type semiconductor regions PR are arranged to be spaced apart from each other along the Y-axis direction when seen in a plan view. Accordingly, it is possible to reduce the on-voltage of the semiconductor chip CHP, and it is possible to reduce a switching loss at the time of turning on of the switching of the IGBT when an inductor having an inductance L is connected as a load to a collector electrode or an emitter electrode of the IGBT (hereinafter, referred to also as "L-load switching").

In the specification of the present application, a switching operation in which the IGBT is switched from an off-state to an on-state is referred to as "turn-on" and a switching operation in which the IGBT is switched from an on-state to an off-state is referred to as "turn-off".

In the active cell region LCa, a plurality of the contact trenches CT serving as opening portions are formed in the p type body region PB. The plurality of contact trenches CT are arranged to be spaced apart from each other along the Y-axis direction when seen in a plan view. Each of the plurality of contact trenches CT reaches the $p^+$ type body contact region PBC arranged in the active cell region LCa.

As illustrated in FIGS. 2 and 6, a region in which the $p^+$ type semiconductor region PR is formed, that is, an active section LCba and a region in which the $p^+$ type semiconductor region PR is not formed, that is, an inactive section LCbi are alternately arranged along the Y-axis direction in the active cell region LCa.

Preferably, in the first embodiment, each of the plurality of n+ type emitter regions NE is arranged at the same position as each of the plurality of p+ type semiconductor regions PR in the Y-axis direction in the active cell region LCa.

In the first embodiment, the p+ type semiconductor region PR including the p+ type body contact region PBC and the p+ type latch-up prevention region PLP is provided in the inactive cell region LCe. In the inactive cell region LCe, the p+ type semiconductor region PR is formed in a part of the semiconductor layer SLn positioned between the trench T3 and the trench T4 and is in contact with the p type body region PB.

In the inactive cell region LCe, the contact trench CT as the opening portion is formed in the p type body region PB. The contact trench CT is continuously formed along the Y-axis direction when seen in a plan view. The contact trench CT reaches the p+ type body contact region PBC arranged in the inactive cell region LCe.

Next, a configuration of the unit cell region LC in the semiconductor chip serving as the semiconductor device according to the first embodiment will be described. Specifically, cross-sectional structures taken along the line A-A, the line B-B and the line C-C of FIG. 3 will be described with reference to FIGS. 4 to 6.

As illustrated in FIGS. 4 to 6, the semiconductor substrate SS has the upper surface Sa serving as a first main surface and the lower surface Sb serving as a second main surface on the opposite side of the upper surface Sa. The n type semiconductor layer SLn is formed in the semiconductor substrate SS, and a semiconductor layer SLp is formed in a part of the semiconductor substrate SS positioned on a side close to the lower surface Sb relative to the semiconductor layer SLn.

In a part of the semiconductor layer SLn other than an upper layer part thereof, an n− type drift region ND serving as an n type semiconductor region is formed. An n type field stop region Ns serving as an n type the semiconductor region is formed between the semiconductor layer SLn and the semiconductor layer SLp. Also, a p+ type collector region CL serving as a p type semiconductor region is formed of the semiconductor layer SLp. Further, a collector electrode CE electrically connected to the p+ type collector region CL, that is, the semiconductor layer SLp is formed on the lower surface Sb of the semiconductor substrate SS.

Meanwhile, in the cell formation region AR1, the p type body region PB is provided in a part of the semiconductor substrate SS on a side close to the upper surface Sa, that is, in an upper layer part of the semiconductor layer SLn.

The trench T1 serving as a trench portion is formed in a part of the semiconductor substrate SS on a side close to the upper surface Sa in the boundary portion between the active cell region LCa and the portion LCi1 of the inactive cell region LCi. The trench T1 reaches the middle of the semiconductor layer SLn from the upper surface Sa, and extends in the Y-axis direction when seen in a plan view.

A gate insulating film GI is formed on an inner wall of the trench T1. The trench gate electrode TG1 serving as the trench electrode is formed on the gate insulating film GI in the trench T1 so as to fill the trench T1. The trench gate electrode TG1 is electrically connected to the gate electrode GE (see FIG. 1). Note that the trench gate electrode TG1 is continuously formed along the Y-axis direction when seen in a plan view.

The trench T2 serving as a trench portion is formed in a part of the semiconductor substrate SS on a side close to the upper surface Sa in the boundary portion between the active cell region LCa and the portion LCi2 of the inactive cell region LCi. The trench T2 reaches the middle of the semiconductor layer SLn from the upper surface Sa, is arranged to be spaced apart from the trench T1, and extends in the Y-axis direction when seen in a plan view.

The gate insulating film GI is formed on an inner wall of the trench T2. The trench gate electrode TG2 serving as the trench electrode is formed on the gate insulating film GI in the trench T2 so as to fill the trench T2. The trench gate electrode TG2 is electrically connected to the gate electrode GE (see FIG. 1). Note that the trench gate electrode TG2 is continuously formed along the Y-axis direction when seen in a plan view.

The trench T3 serving as a trench portion is formed in a part of the semiconductor substrate SS on a side close to the upper surface Sa in the boundary portion between the inactive cell region LCe and the portion LCi2 of the inactive cell region LCi. The trench T3 reaches the middle of the semiconductor layer SLn from the upper surface Sa, is arranged on the opposite side of the trench T1 with the trench T2 interposed therebetween, and extends in the Y-axis direction when seen in a plan view.

The gate insulating film GI is formed on an inner wall of the trench T3. The trench gate electrode TG3 serving as the trench electrode is formed on the gate insulating film GI in the trench T3 so as to fill the trench T3. The trench gate electrode TG3 is electrically connected to the emitter electrode EE. Note that the trench gate electrode TG3 is continuously formed along the Y-axis direction when seen in a plan view.

The trench T4 serving as a trench portion is formed in a part of the semiconductor substrate SS on a side close to the upper surface Sa in the boundary portion between the inactive cell region LCe and the portion LCi3 of the inactive cell region LCi. The trench T4 reaches the middle of the semiconductor layer SLn from the upper surface Sa, is arranged on the opposite side of the trench T2 with the trench T3 interposed therebetween, and extends in the Y-axis direction when seen in a plan view.

The gate insulating film GI is formed on an inner wall of the trench T4. The trench gate electrode TG4 serving as the trench electrode is formed on the gate insulating film GI in the trench T4 so as to fill the trench T4. The trench gate electrode TG4 is electrically connected to the emitter electrode EE. Note that the trench gate electrode TG4 is continuously formed along the Y-axis direction when seen in a plan view.

In the active cell region LCa, the p type body region PB is formed in a part of the semiconductor layer SLn positioned between the trench T1 and the trench T2, and is in contact with the gate insulating film GI formed on the inner wall of the trench T1 and the gate insulating film GI formed on the inner wall of the trench T2. In the inactive cell region LCe, the p type body region PB is formed in apart of the semiconductor layer SLn positioned between the trench T3 and the trench T4, and is in contact with the gate insulating film GI formed on the inner wall of the trench T3 and the gate insulating film GI formed on the inner wall of the trench T4.

In the active cell region LCa, the p type body region PB is formed in an upper layer part of the semiconductor layer SLn positioned between the trench T1 and the trench T2. In addition, in the inactive cell region LCe, the p type body region PB is formed in an upper layer part of the semiconductor layer SLn positioned between the trench T3 and the trench T4.

As illustrated in FIG. 4, in the cross-section taken along the line A-A of FIG. 3, n⁺ type emitter regions NE1 and NE2 as the n⁺ type emitter region NE are formed on the upper surface Sa of the semiconductor substrate SS in the active cell region LCa, and the n⁺ type emitter region NE is not formed on the upper surface Sa of the semiconductor substrate SS in the inactive cell region LCe. Meanwhile, as illustrated in FIG. 5, the n⁺ type emitter region NE is not formed on the upper surface Sa of the semiconductor substrate SS in both the active cell region LCa and the inactive cell region LCe in the cross-section taken along the line B-B of FIG. 3.

In the active cell region LCa, a plurality of the n⁺ type emitter regions NE1 are arranged to be spaced apart from each other along the Y-axis direction when seen in a plan view, and a plurality of the n⁺ type emitter regions NE2 are arranged to be spaced apart from each other along the Y-axis direction when seen in a plan view.

The n⁺ type emitter region NE1 is formed in a part of the semiconductor layer SLn positioned on a side close to the trench T1 between the trench T1 and the trench T2, and is in contact with the p type body region PB and the gate insulating film GI formed on the inner wall of the trench T1. The n⁺ type emitter region NE2 is formed in a part of the semiconductor layer SLn positioned on a side close to the trench T2 between the trench T1 and the trench T2, and is in contact with the p type body region PB and the gate insulating film GI formed on the inner wall of the trench T2. Preferably, the n⁺ type emitter regions NE1 and NE2 are formed on the p type body region PB, that is, a part of the semiconductor layer SLn positioned on a side close to the upper surface Sa relative to the p type body region PB. In addition, preferably, each of the plurality of n⁺ type emitter regions NE1 is arranged at the same position as each of the plurality of p⁺ type semiconductor regions PR in the Y-axis direction, and each of the plurality of n⁺ type emitter regions NE2 is arranged at the same position as each of the plurality of p⁺ type semiconductor regions PR in the Y-axis direction.

The plurality of n⁺ type emitter regions NE1 and the plurality of n⁺ type emitter regions NE2 formed in the active cell region LCa are electrically connected to the emitter electrode EE.

Preferably, an n type hole barrier region NHB serving as an n type semiconductor region is formed between the trench T1 and the trench T2 in a part of the semiconductor layer SLn positioned below the p type body region PB in the active cell region LCa. The n type hole barrier region NHB is arranged on a side close to the lower surface Sb relative to the p type body region PB. An n type impurity concentration of the n type hole barrier region NHB formed in the active cell region LCa is higher than an n type impurity concentration of a part of the semiconductor layer SLn (n⁻ type drift region ND) positioned on a side close to the lower surface Sb relative to the n type hole barrier region NHB. In addition, the n type impurity concentration of the n type hole barrier region NHB formed in the active cell region LCa is lower than an n type impurity concentration of the n⁺ type emitter region NE. Namely, the n type impurity concentration of the n type hole barrier region NHB formed in the active cell region LCa is lower than the n type impurity concentration of any of the n⁺ type emitter regions NE1 and NE2.

In addition, the n type hole barrier region NHB serving as an n type semiconductor region is formed between the trench T3 and the trench T4 in a part of the semiconductor layer SLn positioned below the p type body region PB in the inactive cell region LCe. The n type hole barrier region NHB is arranged on a side close to the lower surface Sb relative to the p type body region PB. An n type impurity concentration of the n type hole barrier region NHB formed in the inactive cell region LCe is higher than an n type impurity concentration of a part of the semiconductor layer SLn (n⁻ type drift region ND) positioned on a side close to the lower surface Sb relative to the n type hole barrier region NHB. In addition, the n type impurity concentration of the n type hole barrier region NHB formed in the inactive cell region LCe is lower than an n type impurity concentration of the n⁺ type emitter region NE formed in the active cell region LCa. Namely, the n type impurity concentration of the n type hole barrier region NHB formed in the inactive cell region LCe is lower than the n type impurity concentration of any of the n⁺ type emitter regions NE1 and NE2 formed in the active cell region LCa.

Note that, in the active cell region LCa, the n type hole barrier region NHB may be in contact with the p type body region PB, the gate insulating film GI formed on the inner wall of the trench T1, and the gate insulating film GI formed on the inner wall of the trench T2. Also, in the inactive cell region LCe, the n type hole barrier region NHB may be in contact with the p type body region PB, the gate insulating film GI formed on the inner wall of the trench T3, and the gate insulating film GI formed on the inner wall of the trench T4. Accordingly, the holes stored in the n⁻ type drift region ND become hard to be discharged to the emitter electrode EE in the active cell region LCa and in the inactive cell region LCe, and thus, it is possible to enhance the IE effect.

In the inactive cell region LCi, the p type floating region PF serving as the p type semiconductor region is provided below the p type body region PB on a side close to the upper surface Sa of the semiconductor substrate SS. Namely, in the portion LCi1 of the inactive cell region LCi, the p type floating region PF is formed in a part of the semiconductor layer SLn positioned on the opposite side of the trench T2 with the trench T1 interposed therebetween. Also, in the portion LCi2 of the inactive cell region LCi, the p type floating region PF is formed in a part of the semiconductor layer SLn positioned between the trench T2 and the trench T3. In addition, in the portion LCi3 of the inactive cell region LCi, the p type floating region PF is formed in a part of the semiconductor layer SLn positioned on the opposite side of the trench T3 with the trench T4 interposed therebetween.

A saturation voltage of a voltage VCE as a collector-emitter voltage in the forward direction is referred to as a voltage VCE (sat). At this time, it is necessary to enhance the IE effect in order to reduce the voltage VCE(sat). Meanwhile, when a load is short-circuited due to malfunction or the like in an inverter to be described later with reference to FIG. 30, a high voltage is applied to the IGBT or a high short-circuit current flows in the IGBT, and it is required that the IGBT does not break down until a protection circuit is cut off. Here, the time for which the IGBT can bear without breaking down when the load is turned into the short-circuited state and the short-circuit current flows in the IGBT is called a load short-circuit tolerance.

It is necessary to reduce the energy to be applied to the IGBT, that is, to reduce the saturation current flowing in the IGBT in order to increase the load short-circuit tolerance. It is necessary to reduce the area of the n⁺ type emitter region NE in order to reduce the saturation current, and two methods are conceivable for reducing the area of the n⁺ type emitter region NE.

The first method is to thin the n⁺ type emitter region NE in the Y-axis direction, but this causes an increase in the voltage VCE(sat).

The second method is to thin the n⁺ type emitter region NE in the X-axis direction by providing the p type floating region PF, and this is the method employed in this embodiment. By this means, a path through which the holes serving as the carriers are discharged is narrowed, and the IE effect is enhanced. Namely, the p type floating region PF is configured to improve the load short-circuit tolerance by thinning the n⁺ type emitter region NE in the X-axis direction.

As described above, in the portion LCi1 of the inactive cell region LCi, the end portion of the p type floating region PF on a side close to the lower surface Sb is arranged close to the lower surface Sb relative to the end portion of the trench T1 on a side close to the lower surface Sb in the Z-axis direction. Also, in the portion LCi2 of the inactive cell region LCi, the end portion of the p type floating region PF on a side close to the lower surface Sb is arranged close to the lower surface Sb relative to both the end portion of the trench T2 on a side close to the lower surface Sb and the end portion of the trench T3 on a side close to the lower surface Sb in the Z-axis direction. In addition, in the portion LCi3 of the inactive cell region LCi, the end portion of the p type floating region PF on a side close to the lower surface Sb is arranged close to the lower surface Sb relative to the end portion of the trench T4 on a side close to the lower surface Sb in the Z-axis direction.

As described above, in the portion LCi1, the p type floating region PF is preferably in contact with the gate insulating film GI formed on the inner wall of the trench T1. Also, in the portion LCi2, the p type floating region PF is preferably in contact with both the gate insulating film GI formed on the inner wall of the trench T2 and the gate insulating film GI formed on the inner wall of the trench T3. In addition, in the portion LCi3, the p type floating region PF is preferably in contact with the gate insulating film GI formed on the inner wall of the trench T4.

As illustrated in FIGS. 4 and 5, the interlayer insulating film IL made of silicon oxide or the like is formed on the upper surface Sa of the semiconductor substrate SS in each of the active cell region LCa, the inactive cell region LCe, and the portions LCi1, LCi2 and LCi3 of the inactive cell region LCi. The interlayer insulating film IL is formed to cover the p type body region PB in each of the active cell region LCa, the inactive cell region LCe, and the portions LCi1, LCi2 and LCi3 of the inactive cell region LCi. Note that an insulating film IF may be formed between the upper surface Sa of the semiconductor substrate SS and the interlayer insulating film IL.

In the first embodiment, the plurality of contact trenches CT are formed as the opening portions which penetrate the interlayer insulating film IL and reach the middle of the semiconductor layer SLn in the active cell region LCa. In the active cell region LCa, the plurality of contact trenches CT are arranged to be spaced apart from each other along the Y-axis direction when seen in a plan view.

Accordingly, the contact trench CT is formed in the cross-section taken along the line A-A of FIG. 3 in the active cell region LCa as illustrated in FIG. 4, but the contact trench CT is not formed in the cross-section taken along the line B-B of FIG. 3 as illustrated in FIG. 5.

Meanwhile, the contact trench CT is formed as the opening portion which penetrates the interlayer insulating film IL and reaches the middle of the semiconductor layer SLn in the inactive cell region LCe. In the inactive cell region LCe, the contact trench CT is continuously formed along the Y-axis direction when seen in a plan view.

In the active cell region LCa, the p⁺ type body contact region PBC serving as the p type semiconductor region is formed in a part of the p type body region PB exposed to the bottom surface of each of the plurality of contact trenches CT as illustrated in FIG. 4. Further, the p⁺ type latch-up prevention region PLP is formed below the p⁺ type body contact region PBC. The p⁺ type semiconductor region PR is formed of the p⁺ type body contact region PBC and the p⁺ type latch-up prevention region PLP.

Namely, in the active cell region LCa, the p⁺ type semiconductor region PR includes the p⁺ type body contact region PBC and the p⁺ type latch-up prevention region PLP. In the active cell region LCa, a p type impurity concentration of the p⁺ type body contact region PBC is higher than a p type impurity concentration of the p⁺ type latch-up prevention region PLP.

Meanwhile, in the inactive cell region LCe, the p⁺ type body contact region PBC serving as the p type semiconductor region is formed in a part of the p type body region PB exposed to the bottom surface of the contact trench CT. In addition, the p⁺ type latch-up prevention region PLP is formed below the p⁺ type body contact region PBC. The p⁺ type semiconductor region PR is formed of the p⁺ type body contact region PBC and the p⁺ type latch-up prevention region PLP.

Namely, in the inactive cell region LCe, the p⁺ type semiconductor region PR includes the p⁺ type body contact region PBC and the p⁺ type latch-up prevention region PLP. In the inactive cell region LCe, a p type impurity concentration of the p⁺ type body contact region PBC is higher than a p type impurity concentration of the p⁺ type latch-up prevention region PLP.

In the active cell region LCa, the plurality of p⁺ type semiconductor regions PR are formed in each part of the p type body region PB exposed to the plurality of contact trenches CT. In addition, in the inactive cell region LCe, the p⁺ type semiconductor region PR is formed in a part of the p type body region PB exposed to the contact trench CT.

In the active cell region LCa, the plurality of p⁺ type semiconductor regions PR are formed in a part of the semiconductor layer SLn positioned between the trench T1 and the trench T2 as illustrated in FIG. 4. In addition, in the inactive cell region LCe, the p⁺ type semiconductor region PR is formed in a part of the semiconductor layer SLn positioned between the trench T3 and the trench T4.

A p type impurity concentration of each of the plurality of p⁺ type semiconductor regions PR is higher than a p type impurity concentration of the p type body region PB in the active cell region LCa, and a p type impurity concentration of the p⁺ type semiconductor region PR is higher than a p type impurity concentration of the p type body region PB in the inactive cell region LCe. In addition, the plurality of p⁺ type semiconductor regions PR are arranged to be spaced apart from each other along the Y-axis direction in the active cell region LCa when seen in a plan view, and the p⁺ type semiconductor region PR is continuously formed along the Y-axis direction in the inactive cell region LCe when seen in a plan view.

A plurality of connection electrodes CP which are embedded respectively in the plurality of contact trenches CT are formed in the active cell region LCa. In addition, the connection electrode CP embedded in the contact trench CT is formed in the inactive cell region LCe.

In the active cell region LCa, each of the plurality of connection electrodes CP is in contact with the n⁺ type emitter region NE and the p+ type semiconductor region PR. Thus, in the active cell region LCa, the n+ type emitter region NE and the plurality of p+ type semiconductor regions PR are electrically connected to the emitter electrode EE via the plurality of connection electrodes CP.

In the inactive cell region LCe, the connection electrode CP is in contact with the p+ type semiconductor region PR. Thus, in the inactive cell region LCe, the p+ type semiconductor region PR is electrically connected to the emitter electrode EE via the connection electrode CP.

In a set of the connection electrode CP and the p+ type semiconductor region PR connected to each other, the connection electrode CP is in contact with the p+ type body contact region PBC included in the p+ type semiconductor regions PR in the active cell region LCa. Accordingly, it is possible to reduce a contact resistance between the connection electrode CP and the p+ type semiconductor region PR in the active cell region LCa.

In addition, the connection electrode CP is in contact with the p+ type body contact region PBC included in the p+ type semiconductor region PR in the inactive cell region LCe. Accordingly, it is possible to reduce the contact resistance between the connection electrode CP and the p+ type semiconductor region PR in the inactive cell region LCe.

As illustrated in FIGS. 4 and 5, the emitter electrode EE made of, for example, a metal film containing aluminum as the major component is formed on the interlayer insulating film IL. In the active cell region LCa, the emitter electrode EE is connected to the n+ type emitter region NE and the p+ type body contact region PBC via the contact trench CT. In addition, in the inactive cell region LCe, the emitter electrode EE is connected to the p+ type body contact region PBC via the contact trench CT. In the example illustrated in FIGS. 4 and 5, the connection electrode CP and the emitter electrode EE are formed in an integrated manner.

Further, the insulating film FPF serving as a passivation film made of a polyimide-based organic insulating film or the like is formed on the emitter electrode EE.

In the active cell region LCa, the IGBT is formed of the collector electrode CE, the p+ type collector region CL, the n− type drift region ND, the p type body region PB, the plurality of p+ type semiconductor regions PR, the n+ type emitter region NE, the trench gate electrodes TG1 and TG2, and the gate insulating films GI formed on each inner wall of the trenches T1 and T2. Meanwhile, in the inactive cell region LCe, the n+ type emitter region NE is not provided, and thus the IGBT is not formed.

Note that a semiconductor region corresponding to the p type floating region PF in the semiconductor device according to the first embodiment is not formed in the technique disclosed in Patent Document 3 described above. In addition, a semiconductor region corresponding to the p type body region PB in the semiconductor device according to the first embodiment is selectively formed in the longitudinal direction between the trenches in the technique disclosed in Patent Document 3 described above unlike the first embodiment.

<Manufacturing Method of Semiconductor Device>

Next, a manufacturing method of the semiconductor device according to the first embodiment will be described. FIGS. 7 to 24 are cross-sectional views showing the main parts of a manufacturing process of the semiconductor device according to the first embodiment. FIGS. 7 to 17, 19 and 21 to 24 are the cross-sectional views taken along the line A-A of FIG. 3 in the same manner as FIG. 4, and FIGS. 18 and 20 are the cross-sectional views taken along the line B-B of FIG. 3 in the same manner as FIG. 5.

In the following, the cell formation region AR1 (see FIG. 2) will be mainly described, and the gate wiring lead-out region AR2 (see FIG. 2) will be described with reference to FIG. 2 as necessary. In addition, a description will be given regarding the unit cell region LC which includes the active cell region LCa, the inactive cell region LCe, and the inactive cell region LCi.

Note that the unit cell region LC includes the positive-side half portion LCi1 of the first inactive cell region LCi arranged to be adjacent on a negative side in the X-axis direction (see FIG. 4) with respect to the active cell region LCa. Also, the unit cell region LC further includes the portion LCi2 which is the second inactive cell region LCi arranged between the active cell region LCa and the inactive cell region LCe. In addition, the unit cell region LC further includes the negative-side half portion LCi3 of the third inactive cell region LCi arranged to be adjacent on a positive side in the X-axis direction with respect to the inactive cell region LCe.

Figure 7:
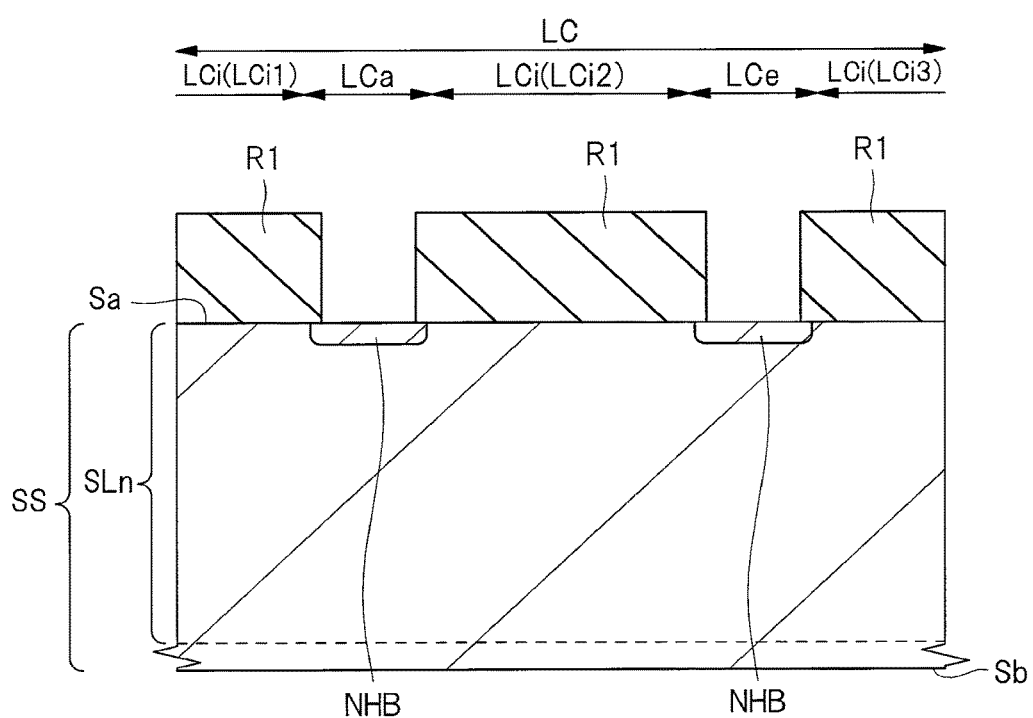
FIG. 7 is a cross-sectional view showing a main part of a manufacturing process of the semiconductor device according to the first embodiment.

First, as illustrated in FIG. 7, the semiconductor substrate SS made of, for example, single crystal silicon into which an n type impurity such as phosphorus (P) is introduced is prepared. The semiconductor substrate SS includes the upper surface Sa serving as the first main surface and the lower surface Sb serving as the second main surface on the opposite side of the upper surface Sa.

It is possible to set the impurity concentration of the n type impurity in the semiconductor substrate SS to, for example, about $2 \times 10^{14}$ cm$^{-3}$. In this step, the semiconductor substrate SS is a thin semiconductor plate with an approximately circular planar shape referred to as a wafer. It is possible to set a thickness of the semiconductor substrate SS to, for example, about 450 μm to 1000 μm.

In the semiconductor substrate SS, the semiconductor layer on a side close to the upper surface Sa relative to the semiconductor layer in which the n type field stop region Ns (see FIG. 4) is formed is defined as the semiconductor layer SLn. The semiconductor layer SLn is an n type semiconductor layer. Thus, the n type semiconductor layer SLn is formed in the semiconductor substrate SS when the semiconductor substrate SS is prepared.

Next, a resist film R1 for introduction of the n type hole barrier region is formed on the entire upper surface Sa of the semiconductor substrate SS by coating or the like, and the resist film R1 is patterned by general lithography. An n type impurity is introduced into the upper surface Sa of the semiconductor substrate SS by, for example, ion implantation using the patterned resist film R1 as a mask, thereby forming the n type hole barrier region NHB. For example, an ion implantation condition in which the ionic species is phosphorus (P), the dose amount is set to about $6 \times 10^{12}$ cm$^{-2}$ and implantation energy is set to about 80 KeV can be shown as a preferable example of the condition of ion implantation at this time. Thereafter, the resist film R1 which is no longer needed is removed by ashing or the like.

Figure 8:
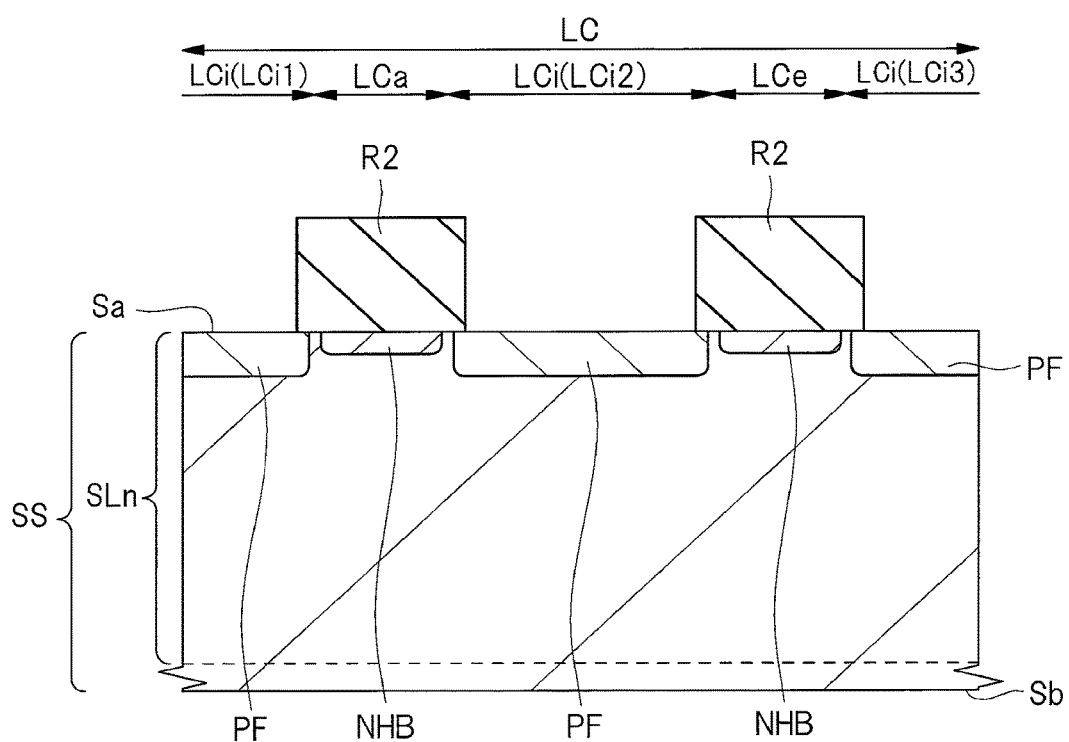
FIG. 8 is a cross-sectional view showing a main part of the manufacturing process of the semiconductor device according to the first embodiment.

Next, as illustrated in FIG. 8, a resist film R2 for introduction of the p type floating region is formed on the upper surface Sa of the semiconductor substrate SS by coating or the like, and the resist film R2 is patterned by general lithography. A p type impurity is introduced into the upper surface Sa of the semiconductor substrate SS by, for example, ion implantation using the patterned resist film R2 as a mask, thereby forming the p type floating region PF. For example, an ion implantation condition in which the ionic species is boron (B), the dose amount is set to about $3.5 \times 10^{13}$ cm$^{-2}$ and the implantation energy is set to about 75 KeV can be shown as a preferable example of a condition of the ion implantation at this time. Thereafter, the resist film R2 which has been no longer needed is removed by ashing or the like. Note that the p type floating region PFp is formed in, for example, the gate wiring lead-out region AR2 (see FIG. 2) when the p type floating region PF is formed in the cell formation region AR1 (see FIG. 2).

Figure 9:
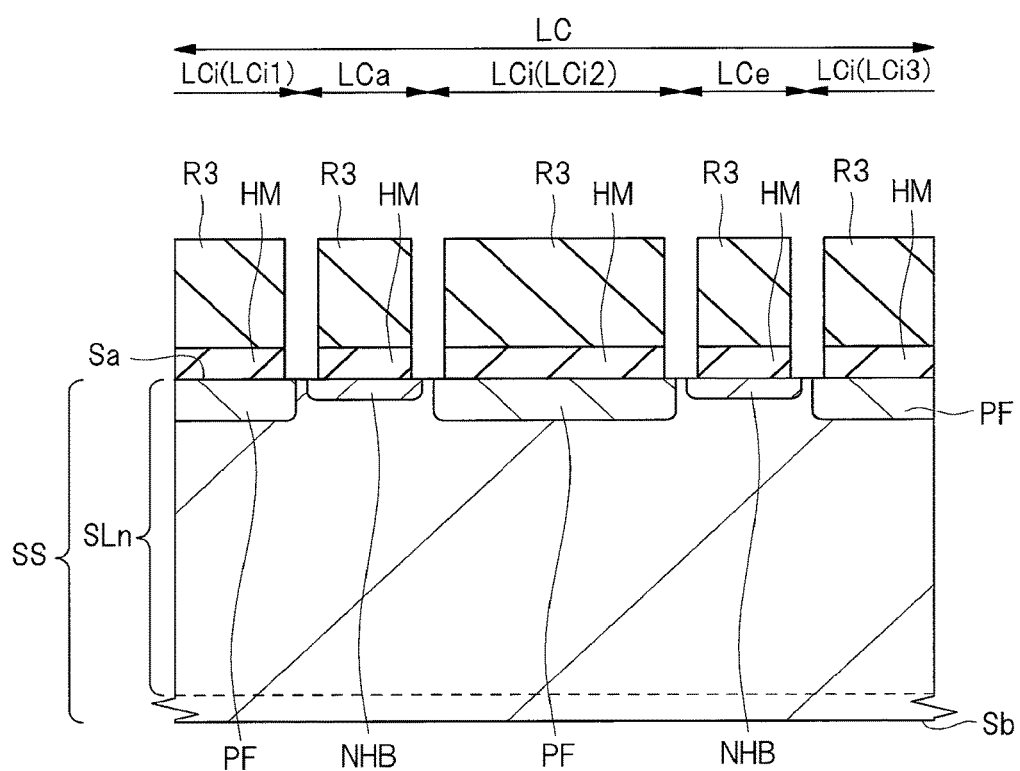
FIG. 9 is a cross-sectional view showing a main part of the manufacturing process of the semiconductor device according to the first embodiment.

Next, as illustrated in FIG. 9, a hard mask film HM made of, for example, silicon oxide is formed on the upper surface Sa of the semiconductor substrate SS by, for example, chemical vapor deposition (CVD) method. A thickness of the hard mask film HM is, for example, about 450 nm.

Next, as illustrated in FIG. 9, a resist film R3 for processing of the hard mask film is formed on the upper surface Sa of the semiconductor substrate SS by coating or the like, and the resist film R3 is patterned by general lithography. The hard mask film HM is patterned by, for example, dry etching using the patterned resist film R3 as a mask.

Figure 10:
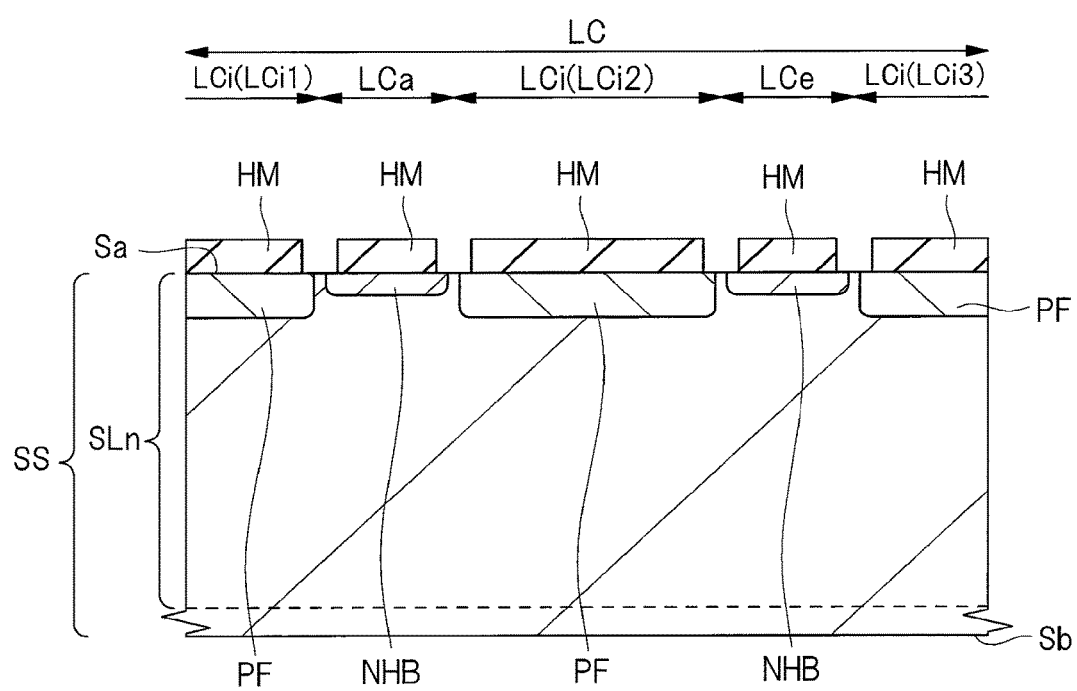
FIG. 10 is a cross-sectional view showing a main part of the manufacturing process of the semiconductor device according to the first embodiment.

Thereafter, the resist film R3 which has been no longer needed is removed by ashing or the like as illustrated in FIG. 10.

Figure 11:
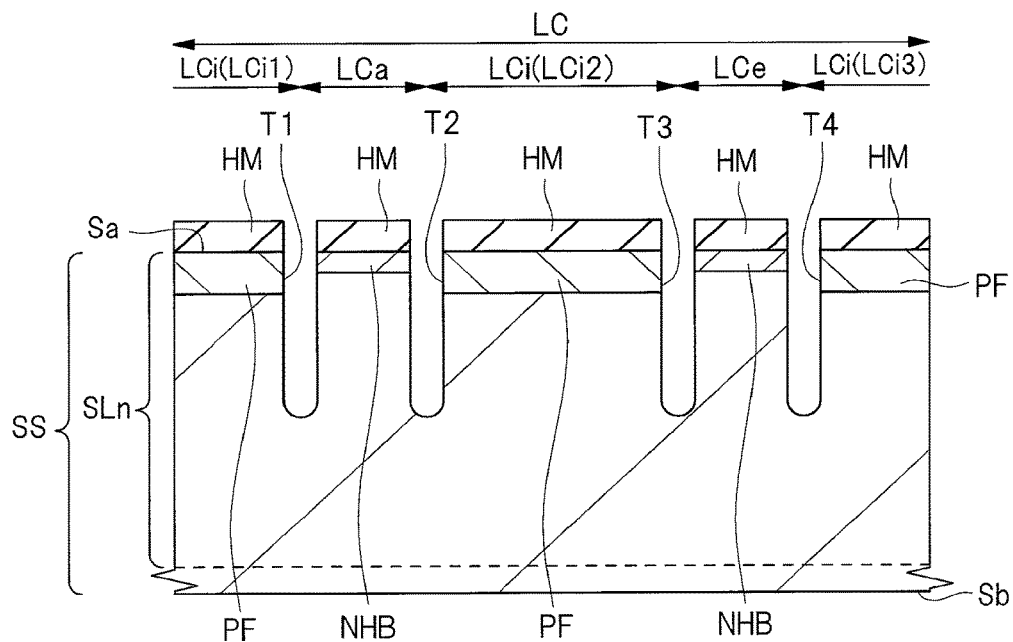
FIG. 11 is a cross-sectional view showing a main part of the manufacturing process of the semiconductor device according to the first embodiment.

Next, as illustrated in FIG. 11, the trenches T1, T2, T3 and T4 are formed by, for example, anisotropic dry etching using the patterned hard mask film HM. At this time, the trench T1, which reaches the middle of the semiconductor layer SLn from the upper surface Sa of the semiconductor substrate SS and extends in the Y-axis direction (see FIG. 4) when seen in a plan view, is formed. Also, the trench T2, which reaches the middle of the semiconductor layer SLn from the upper surface Sa of the semiconductor substrate SS, is arranged to be spaced apart from the trench T1 and extends in the Y-axis direction when seen in a plan view, is formed. Further, the trench T3, which reaches the middle of the semiconductor layer SLn from the upper surface Sa of the semiconductor substrate SS, is arranged on the opposite side of the trench T1 with the trench T2 interposed therebetween and extends in the Y-axis direction when seen in a plan view, is formed. In addition, the trench T4, which reaches the middle of the semiconductor layer SLn from the upper surface Sa of the semiconductor substrate SS, is arranged on the opposite side of the trench T2 with the trench T3 interposed therebetween and extends in the Y-axis direction when seen in a plan view, is formed. For example, $Cl_2/O_2$-based gas can be shown as a preferable example of the gas for the anisotropic dry etching.

Figure 12:
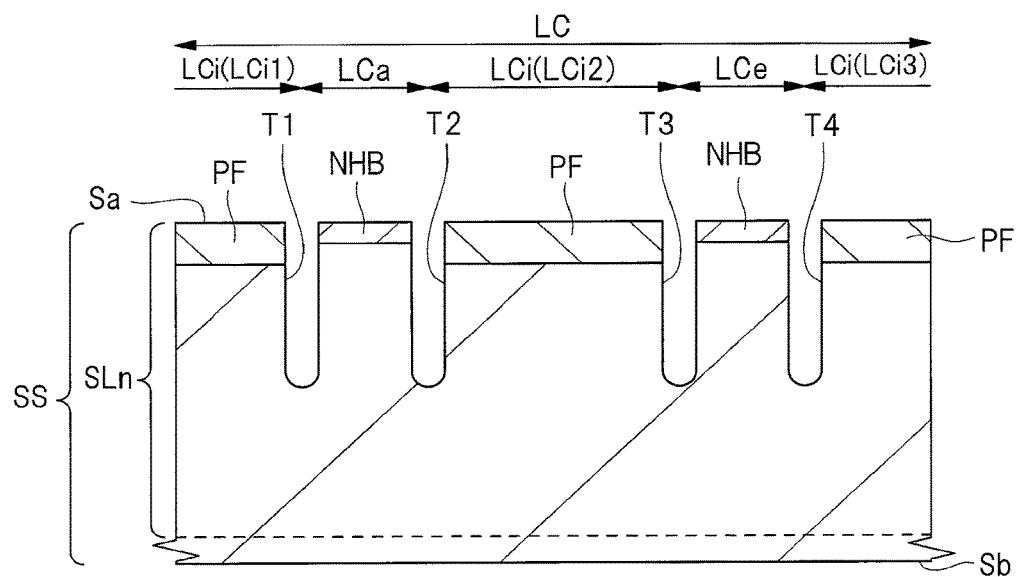
FIG. 12 is a cross-sectional view showing a main part of the manufacturing process of the semiconductor device according to the first embodiment.

Thereafter, as illustrated in FIG. 12, the hard mask film HM which has been no longer needed is removed by, for example, wet etching using hydrofluoric acid-based etching solution.

Figure 13:
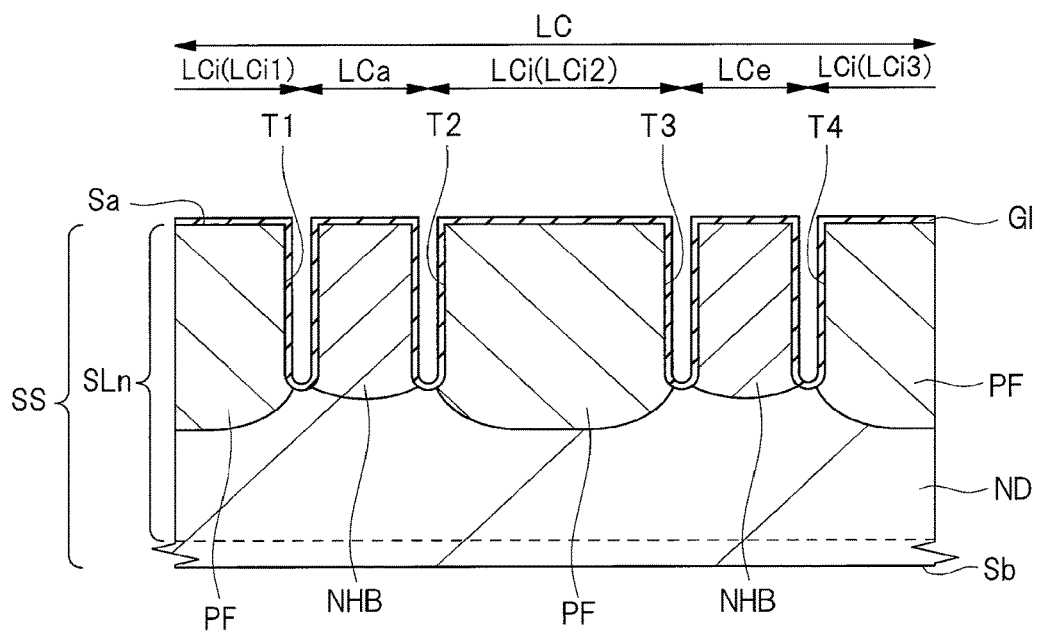
FIG. 13 is a cross-sectional view showing a main part of the manufacturing process of the semiconductor device according to the first embodiment.

Next, as illustrated in FIG. 13, stretching diffusion is executed (for example, at 1200° C. for 30 minutes) to the p type floating region PF and the n type hole barrier region NHB. At this time, the stretching diffusion is performed so that the end portion of the p type floating region PF on a side close to the lower surface Sb is arranged close to the lower surface Sb in the Z-axis direction relative to any of the end portion of the trench T1 on a side close to the lower surface Sb, the end portion of the trench T2 on a side close to the lower surface Sb, the end portion of the trench T3 on a side close to the lower surface Sb, and the end portion of the trench T4 on a side close to the lower surface Sb.

Thus, the p type floating region PF is formed in a part of the semiconductor layer SLn positioned on the opposite side of the trench T2 with the trench T1 interposed therebetween. Also, the p type floating region PF is formed in apart of the semiconductor layer SLn positioned between the trench T2 and the trench T3. In addition, the p type floating region PF is formed in a part of the semiconductor layer SLn positioned on the opposite side of the trench T3 with the trench T4 interposed therebetween.

Preferably, the p type floating region PF formed on the opposite side of the trench T2 with the trench T1 interposed therebetween is in contact with the gate insulating film GI formed on the inner wall of the trench T1. Also, the p type floating region PF formed between the trench T2 and the trench T3 is in contact with both the gate insulating film GI formed on the inner wall of the trench T2 and the gate insulating film GI formed on the inner wall of the trench T3. In addition, the p type floating region PF formed on the opposite side of the trench T3 with the trench T4 interposed therebetween is in contact with the gate insulating film GI formed on the inner wall of the trench T4.

The end portion of the p type floating region PF, which is formed on the opposite side of the trench T2 with the trench T1 interposed therebetween, on a side close to the lower surface Sb is arranged close to the lower surface Sb in the Z-axis direction relative to the end portion of the trench T1 on a side close to the lower surface Sb. Also, the end portion of the p type floating region PF, which is formed between the trench T2 and the trench T3, on a side close to the lower surface Sb is arranged close to the lower surface Sb in the Z-axis direction relative to both the end portion of the trench T2 on a side close to the lower surface Sb and the end portion of the trench T3 on a side close to the lower surface Sb. In addition, the end portion of the p type floating region PF, which is formed on the opposite side of the trench T3 with the trench T4 interposed therebetween, on a side close to the lower surface Sb is arranged close to the lower surface Sb in the Z-axis direction relative to the end portion of the trench T4 on a side close to the lower surface Sb.

In addition, the n type hole barrier region NHB is formed in each part of the semiconductor layer SLn positioned between the trench T1 and the trench T2 and positioned between the trench T3 and the trench T4. Preferably, the n type hole barrier region NHB formed between the trench T1 and the trench T2 is in contact with the gate insulating film GI formed on the inner wall of the trench T1 and the gate insulating film GI formed on the inner wall of the trench T2. In addition, the n type hole barrier region NHB formed between the trench T3 and the trench T4 is preferably in contact with the gate insulating film GI formed on the inner wall of the trench T3 and the gate insulating film GI formed on the inner wall of the trench T4.

In addition, a region of the n type semiconductor substrate SS in which the p type floating region PF and the n type hole barrier region NHB are not formed at the time of stretching diffusion becomes the n⁻ type drift region ND. In other words, a region of the n type semiconductor layer SLn in which the p type floating region PF and the n type hole barrier region NHB are not formed becomes the n⁻ type drift region ND. Note that the n⁻ type drift region ND is formed from an inside of the semiconductor layer SLn to the lower surface Sb of the semiconductor substrate SS in the process illustrated in FIG. 13.

The n type impurity concentration of the n type hole barrier region NHB formed between the trench T1 and the trench T2 is higher than the n type impurity concentration of a part of the semiconductor layer SLn positioned on a side close to the lower surface Sb relative to the corresponding n type hole barrier region NHB, that is, the n⁻ type drift region ND. In addition, the n type impurity concentration of the n type hole barrier region NHB formed between the trench T1 and the trench T2 is lower than the n type impurity concentration of each of the n⁺ type emitter region NE (see FIG. 17 to be described later) and the n⁺ type emitter regions NE1 and NE2 (see FIG. 21 to be described later).

The n type impurity concentration of the n type hole barrier region NHB formed between the trench T3 and the trench T4 is higher than the n type impurity concentration of a part of the semiconductor layer SLn positioned on a side close to the lower surface Sb relative to the corresponding n type hole barrier region NHB, that is, the n⁻ type drift region ND. In addition, the n type impurity concentration of the n type hole barrier region NHB formed between the trench T3 and the trench T4 is lower than the n type impurity concentration of each of the n⁺ type emitter region NE (see FIG. 17 to be described later) and the n⁺ type emitter regions NE1 and NE2 (see FIG. 21 to be described later).

Next, as illustrated in FIG. 13, the gate insulating film GI made of, for example, silicon oxide is formed on the upper surface Sa of the semiconductor substrate SS and each inner wall of the trenches T1, T2, T3 and T4 by, for example, a thermal oxidation method or the like. A thickness of the gate insulating film GI is, for example, about 0.12 μm.

Figure 14:
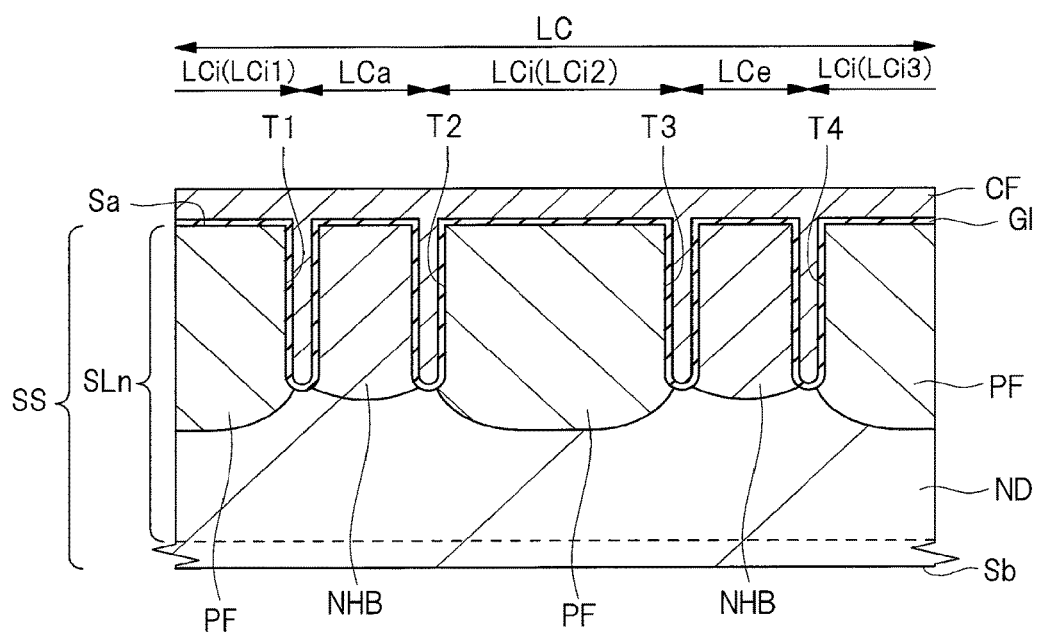
FIG. 14 is a cross-sectional view showing a main part of the manufacturing process of the semiconductor device according to the first embodiment.

Next, as illustrated in FIG. 14, a conductive film CF made of polycrystalline silicon doped with phosphorus (P) (Doped Poly-Silicon) is deposited by, for example, a CVD method or the like on the upper surface Sa of the semiconductor substrate SS and in each of the trenches T1, T2, T3 and T4. A thickness of the conductive film CF is, for example, about 0.6 μm.

Figure 15:
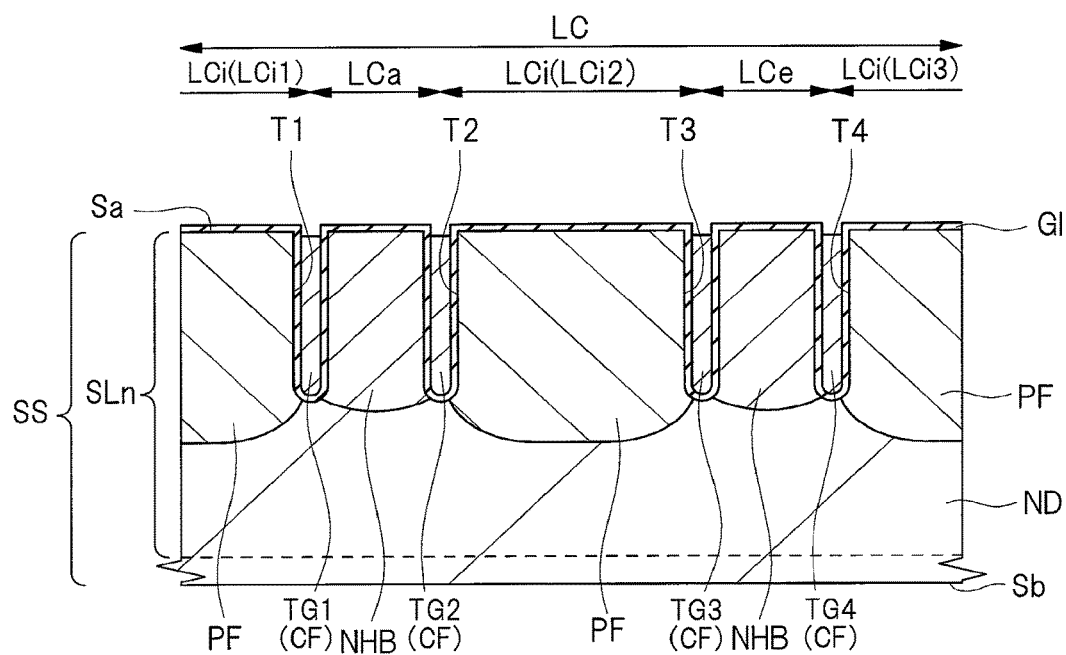
FIG. 15 is a cross-sectional view showing a main part of the manufacturing process of the semiconductor device according to the first embodiment.

Next, as illustrated in FIG. 15, the conductive film CF is etched back by, for example, dry etching or the like. In this manner, the trench gate electrode TG1 formed of the conductive film CF embedded in the trench T1 with the gate insulating film GI interposed therebetween is formed, and the trench gate electrode TG2 formed of the conductive film CF embedded in the trench T2 with the gate insulating film GI interposed therebetween is formed. In addition, the trench gate electrode TG3 formed of the conductive film CF embedded in the trench T3 with the gate insulating film GI interposed therebetween is formed, and the trench gate electrode TG4 formed of the conductive film CF embedded in the trench T4 with the gate insulating film GI interposed therebetween is formed.

In other words, the trench gate electrode TG1 is formed on the gate insulating film GI so as to fill the trench T1, and the trench gate electrode TG2 is formed on the gate insulating film GI so as to fill the trench T2. In addition, the trench gate electrode TG3 is formed on the gate insulating film GI so as to fill the trench T3, and the trench gate electrode TG4 is formed on the gate insulating film GI so as to fill the trench T4. For example, a $SF_6$ gas or the like can be shown as a preferable example of the gas of the etching.

Figure 16:
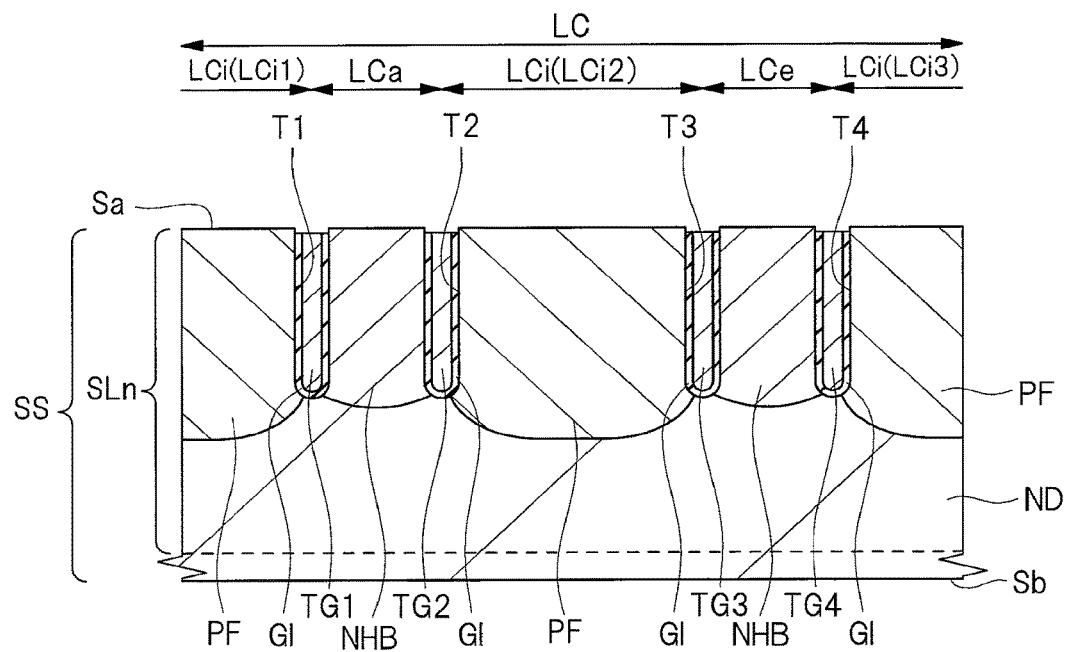
FIG. 16 is a cross-sectional view showing a main part of the manufacturing process of the semiconductor device according to the first embodiment.

Next, as illustrated in FIG. 16, the gate insulating film GI other than those in the trenches T1, T2, T3 and T4 is removed by dry etching or the like.

Figure 17:
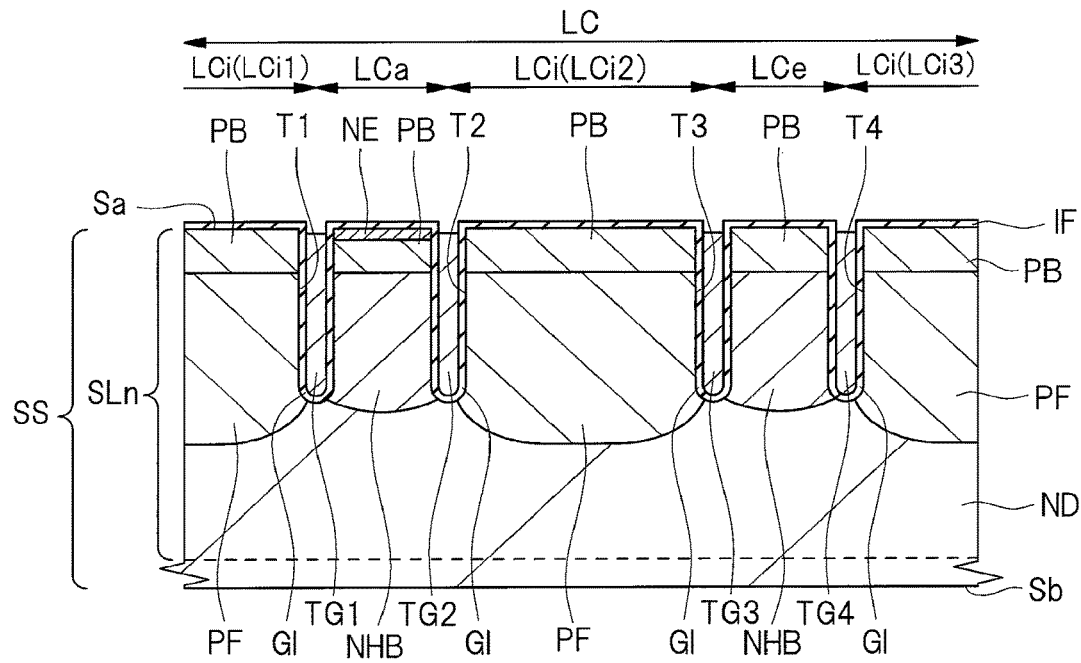
FIG. 17 is a cross-sectional view showing a main part of the manufacturing process of the semiconductor device according to the first embodiment.
Figure 18:
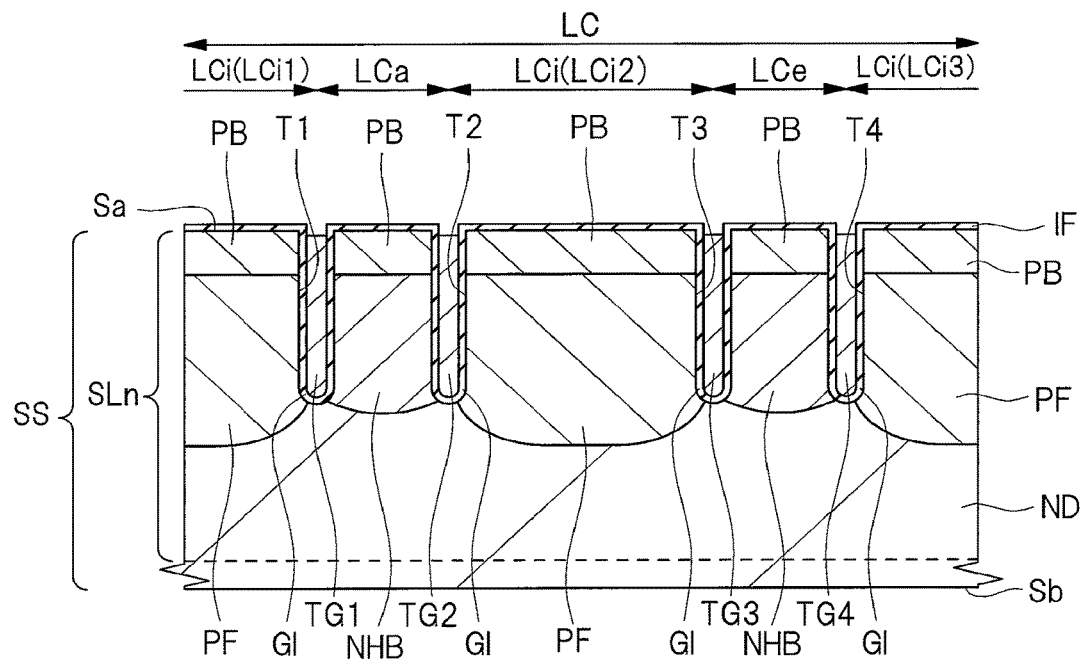
FIG. 18 is a cross-sectional view showing a main part of the manufacturing process of the semiconductor device according to the first embodiment.

Next, as illustrated in FIG. 17, the insulating film IF which is formed of a relatively thin silicon oxide film (for example, with approximately the same thickness as the gate insulating film GI) for the subsequent ion implantation is formed on the upper surface Sa of the semiconductor substrate SS by, for example, thermal oxidation or CVD method. Next, the resist film for introduction of the p type body region (not illustrated) is formed on the upper surface Sa of the semiconductor substrate SS by general lithography. The p type body region PB is formed by introducing the p type impurity into the entire surface of the cell formation region AR1 (see FIG. 2) and the other required portions by, for example, ion implantation using the resist film for introduction of the p type body region as a mask.

Specifically, the p type body region PB which is in contact with the gate insulating film GI formed on the inner wall of the trench T1 and the gate insulating film GI formed on the inner wall of the trench T2 is formed in a part of the semiconductor layer SLn positioned between the trench T1 and the trench T2. In addition, the p type body region PB which is in contact with the gate insulating film GI formed on the inner wall of the trench T3 and the gate insulating film GI formed on the inner wall of the trench T4 is formed in a part of the semiconductor layer SLn positioned between the trench T3 and the trench T4.

For example, an ion implantation condition in which the ionic species is boron (B), the dose amount is set to about $3 \times 10^{13}$ cm⁻² and implantation energy is set to about 75 KeV can be shown as a preferable example of the condition of ion implantation at this time. Thereafter, the resist film for introduction of the p type body region which has been no longer needed is removed by ashing or the like.

Further, a resist film for introduction of the n⁺ type emitter region (not illustrated) is formed on the upper surface Sa of the semiconductor substrate SS by general lithography. The n⁺ type emitter region NE is formed by introducing the n type impurity in the upper layer part of the p type body region PB of the active cell region LCa by, for example, ion implantation using the resist film for introduction of the n⁺ type emitter region as a mask.

Specifically, the n⁺ type emitter region NE which is in contact with the gate insulating film GI formed on the inner wall of the trench T1, the gate insulating film GI formed on the inner wall of the trench T2 and the p type body region PB is formed in a part of the semiconductor layer SLn positioned between the trench T1 and the trench T2. Note that the n⁺ type emitter region NE is not formed in a part of the semiconductor layer SLn positioned between the trench T3 and the trench T4.

An ion implantation condition in which the ionic species is arsenic (As), the dose amount is set to about $5 \times 10^{15}$ cm⁻², and implantation energy is set to about 80 KeV can be shown as a preferable example of the condition of ion implantation at this time. Thereafter, the resist film for introduction of the n⁺ type emitter region which has been no longer needed is removed by ashing or the like.

Here, the cross-section illustrated in FIG. 17 corresponds to the cross-section taken along the line A-A of FIG. 3, that is, the cross-section illustrated in FIG. 4. Meanwhile, the n⁺ type emitter region NE is not formed in the cross-section taken along the line B-B of FIG. 3, that is, a cross-section corresponding to the cross-section illustrated in FIG. 5, and thus, the state illustrated in FIG. 18 is formed.

Figure 19:
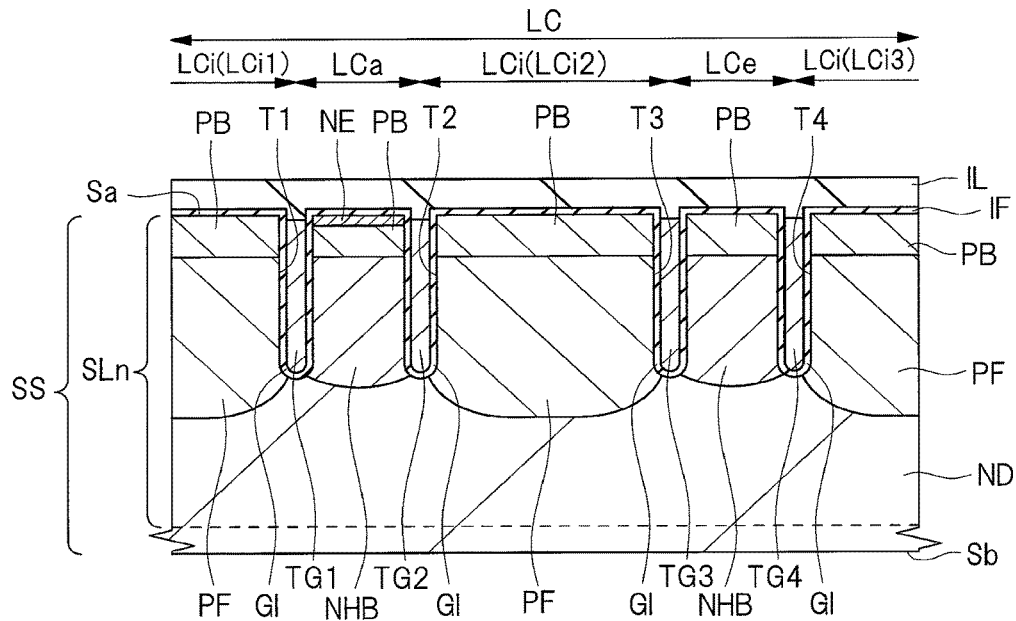
FIG. 19 is a cross-sectional view showing a main part of the manufacturing process of the semiconductor device according to the first embodiment.
Figure 20:
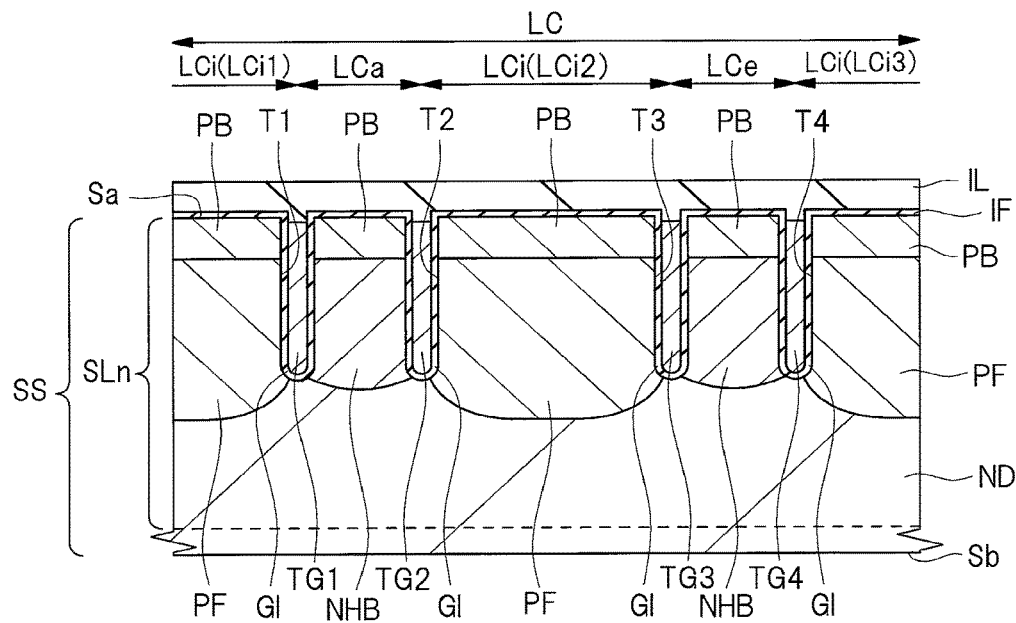
FIG. 20 is a cross-sectional view showing a main part of the manufacturing process of the semiconductor device according to the first embodiment.

Next, as illustrated in FIG. 19, the interlayer insulating film IL made of, for example, a phosphosilicate glass (PSG) film is formed on the upper surface Sa of the semiconductor substrate SS by, for example, a CVD method or the like. The interlayer insulating film IL is formed to cover the p type body region PB with the insulating film IF interposed therebetween. A thickness of the interlayer insulating film IL is, for example, about 0.6 μm. A borophosphosilicate glass (BPSG) film, a non-doped silicate glass (NSG) film, a spin-on-glass (SOG) film, or a composite film thereof can be shown as a preferable example of a material of the interlayer insulating film IL other than the PSG film.

Here, the cross-section illustrated in FIG. 19 corresponds to the cross-section taken along the line A-A of FIG. 3, that is, the cross-section illustrated in FIG. 4. Meanwhile, the n⁺ type emitter region NE is not formed in the cross-section taken along the line B-B of FIG. 3, that is, a cross-section corresponding to the cross-section illustrated in FIG. 5, and thus, the state illustrated in FIG. 20 is formed.

Figure 21:
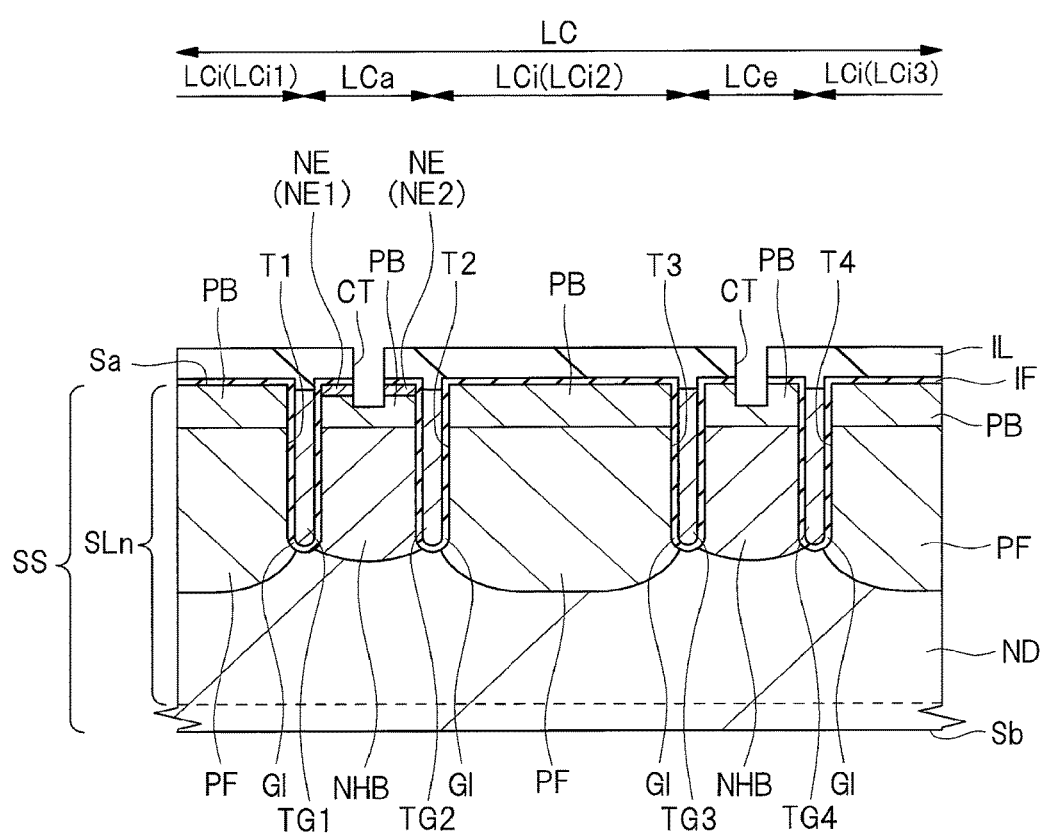
FIG. 21 is a cross-sectional view showing a main part of the manufacturing process of the semiconductor device according to the first embodiment.

Next, as illustrated in FIG. 21, a resist film for formation of the contact trench (not illustrated) is formed on the interlayer insulating film IL by general lithography. Subsequently, the contact trench CT is formed by, for example, anisotropic dry etching or the like. For example, a mixed gas containing an Ar gas, a $CHF_3$ gas and a $CF_4$ gas can be shown as a preferable example of the gas used in this anisotropic dry etching. Thereafter, the resist film for formation of the contact trench which has been no longer needed is removed by ashing or the like.

Next, as illustrated in FIG. 21, the contact trench CT is extended inside the semiconductor substrate SS by, for example, anisotropic dry etching. For example, a $Cl_2/O_2$ gas can be shown as a preferable example of the gas of the anisotropic dry etching.

Here, the cross-section illustrated in FIG. 21 corresponds to the cross-section taken along the line A-A of FIG. 3, that is, the cross-section illustrated in FIG. 4. Meanwhile, in the cross-section taken along the line B-B of FIG. 3, that is, the cross-section corresponding to the cross-section illustrated in FIG. 5, the contact trench CT is not formed in the active cell region LCa.

By performing the process illustrated in FIG. 21, the plurality of contact trenches CT serving as the opening portions, which penetrate the interlayer insulating film IL and reach depth positions in the middle of the p type body region PB, are formed in the active cell region LCa. In the active cell region LCa, the plurality of contact trenches CT are arranged to be spaced apart from each other along the Y-axis direction (see FIG. 4) when seen in a plan view. At this time, the $n^+$ type emitter region NE1, which is in contact with the p type body region PB and the gate insulating film GI formed on the inner wall of the trench T1, is formed as the $n^+$ type emitter region NE in a part of the semiconductor layer SLn positioned between the trench T1 and the trench T2. In addition, the $n^+$ type emitter region NE2, which is in contact with the p type body region PB and the gate insulating film GI formed on the inner wall of the trench T2, is formed as the $n^+$ type emitter region NE in a part of the semiconductor layer SLn positioned between the trench T1 and the trench T2.

In addition, by performing the process illustrated in FIG. 21, the contact trench CT, which penetrates the interlayer insulating film IL and reaches a depth position in the middle of the p type body region PB, is formed as the opening portion in the inactive cell region LCe. In the inactive cell region LCe, the contact trench CT is continuously formed along the Y-axis direction when seen in a plan view.

Figure 22:
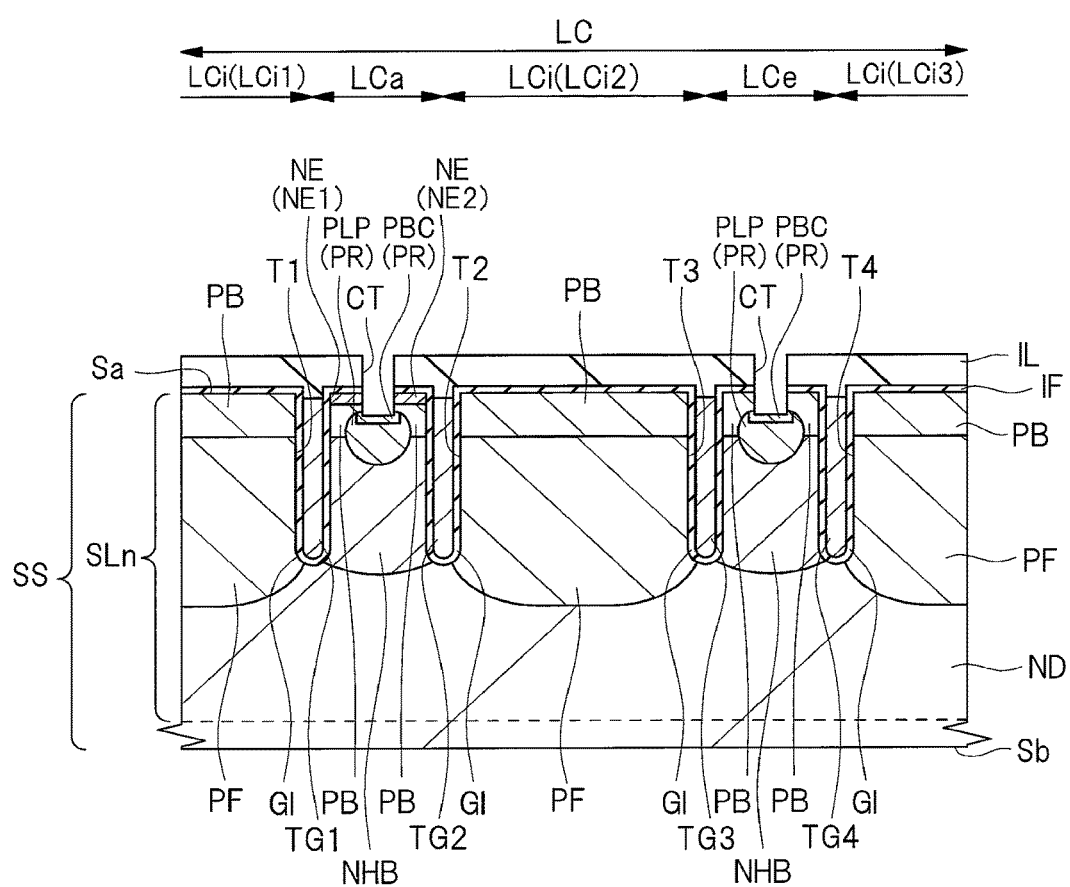
FIG. 22 is a cross-sectional view showing a main part of the manufacturing process of the semiconductor device according to the first embodiment.

Next, as illustrated in FIG. 22, the $p^+$ type body contact region PBC is formed by, for example, performing the ion implantation of the p type impurity through the contact trench CT. For example, an ion implantation condition in which the ionic species is boron (B), the dose amount is set to about $5 \times 10^{15}$ $cm^{-2}$, and the implantation energy is set to about 80 KeV can be shown as a preferable example of a condition of the ion implantation at this time.

Similarly, the $p^+$ type latch-up prevention region PLP is formed by, for example, performing the ion implantation of the p type impurity through the contact trench CT. For example, an ion implantation condition in which the ionic species is boron (B), the dose amount is set to about $5 \times 10^{15}$ $cm^{-2}$, and the implantation energy is set to about 80 KeV can be shown as a preferable example of a condition of the ion implantation at this time. The p type impurity concentration of the $p^+$ type body contact region PBC is higher than the p type impurity concentration of the $p^+$ type latch-up prevention region PLP. In addition, the $p^+$ type semiconductor region PR is formed of the $p^+$ type body contact region PBC and the $p^+$ type latch-up prevention region PLP.

Here, the cross-section illustrated in FIG. 22 corresponds to the cross-section taken along the line A-A of FIG. 3, that is, the cross-section illustrated in FIG. 4. Meanwhile, in the cross-section taken along the line B-B of FIG. 3, that is, the cross-section corresponding to the cross-section illustrated in FIG. 5, the $p^+$ type semiconductor region PR formed of the $p^+$ type body contact region PBC and the $p^+$ type latch-up prevention region PLP is not formed in the active cell region LCa.

By performing the process illustrated in FIG. 22, the plurality of $p^+$ type semiconductor regions PR are formed in a part of the p type body region PB exposed to each of the contact trenches CT in the active cell region LCa. In the active cell region LCa, the plurality of $p^+$ type semiconductor regions PR are arranged to be spaced apart from each other in the Y-axis direction (see FIG. 4) when seen in a plan view.

In addition, by performing the process illustrated in FIG. 22, the $p^+$ type semiconductor region PR is formed in a part of the p type body region PB exposed to the contact trench CT in the inactive cell region LCe. In the inactive cell region LCe, the $p^+$ type semiconductor region PR is continuously formed along the Y-axis direction when seen in a plan view.

Namely, by performing the process illustrated in FIG. 22, the plurality of $p^+$ type semiconductor regions PR which are in contact with the p type body region PB are formed in a part of the semiconductor layer SLn positioned between the trench T1 and the trench T2. In addition, the $p^+$ type semiconductor region PR which is in contact with the p type body region PB is formed in a part of the semiconductor layer SLn positioned between the trench T3 and the trench T4. In the active cell region LCa, the p type impurity concentration of each of the plurality of $p^+$ type semiconductor regions PR is higher than the p type impurity concentration of the p type body region PB. Also, in the inactive cell region LCe, the p type impurity concentration of the $p^+$ type semiconductor region PR is higher than the p type impurity concentration of the p type body region PB.

In the manufacturing process of the semiconductor device according to the first embodiment, the plurality of contact trenches CT which are arranged to be spaced apart from each other along the Y-axis direction (see FIG. 4) when seen in a plan view are formed in the active cell region LCa. Thereafter, the plurality of $p^+$ type semiconductor regions PR which are arranged to be spaced apart from each other along the Y-axis direction when seen in a plan view can be formed with using the interlayer insulating film IL having the plurality of contact trenches CT formed therein as a mask. Thus, in the manufacturing process of the semiconductor device according to the first embodiment, there is no need of additionally preparing the mask for formation of the plurality of $p^+$ type semiconductor regions PR, and there is no need of additionally performing the lithography for formation of the plurality of $p^+$ type semiconductor regions PR.

Figure 23:
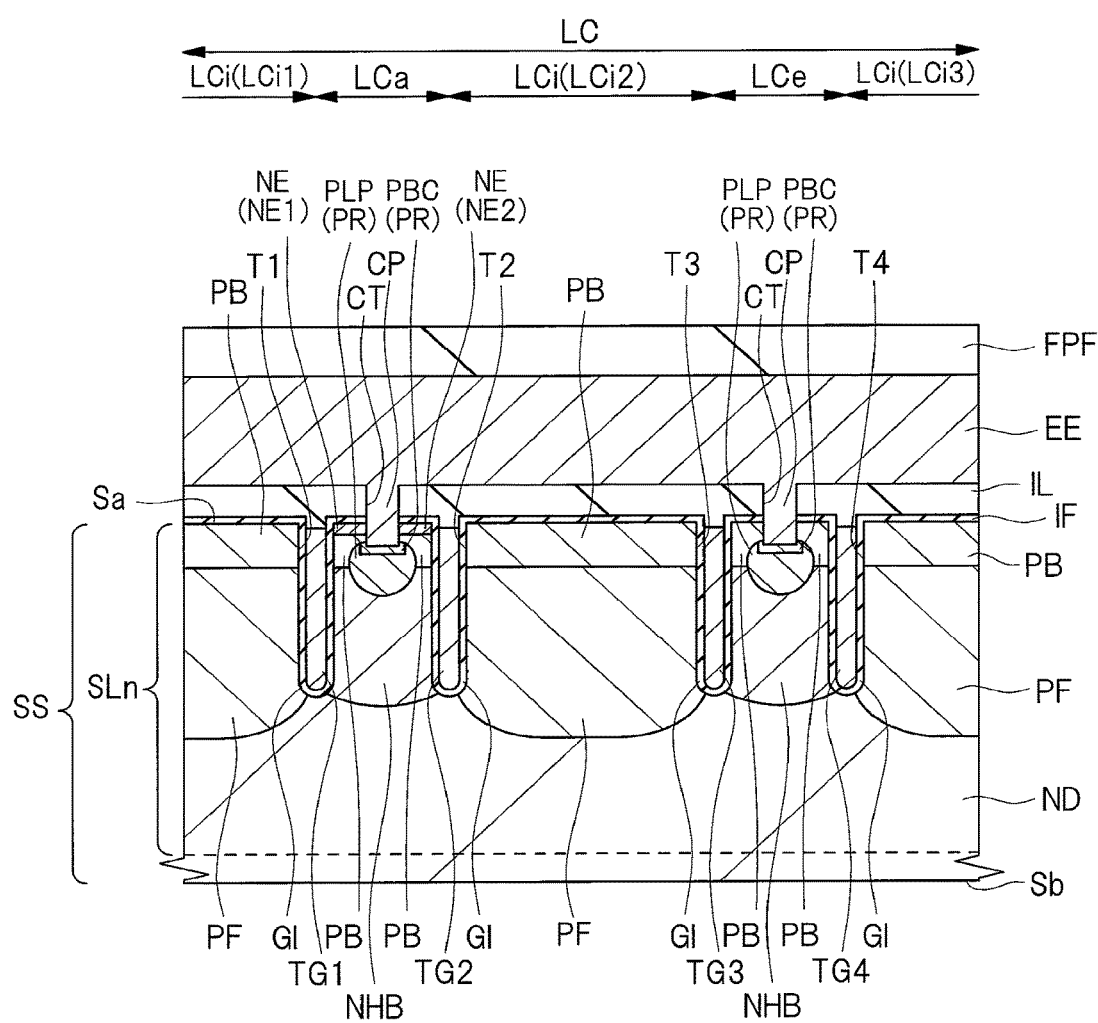
FIG. 23 is a cross-sectional view showing a main part of the manufacturing process of the semiconductor device according to the first embodiment.

Next, as illustrated in FIG. 23, the emitter electrode EE is formed. Specifically, the formation is executed in the following manner. First, a TiW film serving as a barrier metal film is formed on the upper surface Sa of the semiconductor substrate SS by, for example, sputtering. A thickness of the TiW film is, for example, about 0.2 μm. The most part of titanium in the TiW film is moved to a silicon interface by the subsequent heat treatment to form silicide, and contributes to the improvement in contact characteristics, but these processes are not illustrated in the drawings due to the complexity.

Next, silicide annealing at about 600° C. for about 10 minutes is executed under the nitrogen atmosphere, and then an aluminum-based metal film (for example, made of aluminum to which several % of silicon is added) is formed by, for example, sputtering on the entire surface of the barrier metal film so as to fill the contact trench CT. A thickness of the aluminum-based metal film is, for example, about 5 μm.

Next, a resist film (not illustrated) for formation of the emitter electrode is formed by general lithography. Subsequently, the emitter electrode EE formed of the aluminum-based metal film and the barrier metal film is patterned by, for example, dry etching. A $Cl_2/BCl_3$ gas or the like can be shown as a preferable example of the gas of the dry etching. Thereafter, the resist film for formation of the emitter electrode which has been no longer needed is removed by ashing or the like.

Here, the cross-section illustrated in FIG. 23 corresponds to the cross-section taken along the line A-A of FIG. 3, that is, the cross-section illustrated in FIG. 4. Meanwhile, the contact trench CT is not formed in the active cell region LCa in the cross-section taken along the line B-B of FIG. 3, and thus, the state in the cross-section illustrated in FIG. 5 is formed.

By performing the process illustrated in FIG. 23, the plurality of connection electrodes CP which are embedded respectively in the plurality of contact trenches CT and the emitter electrode EE which is formed on the interlayer insulating film IL are formed in the active cell region LCa. In the active cell region LCa, the plurality of connection electrodes CP are arranged to be spaced apart from each other along the Y-axis direction (see FIG. 4) when seen in a plan view. In addition, by performing the process illustrated in FIG. 23, the connection electrode CP embedded in the contact trench CT and the emitter electrode EE formed on the interlayer insulating film IL are formed in the inactive cell region LCe. In the inactive cell region LCe, the connection electrode CP is continuously formed along the Y-axis direction when seen in a plan view.

The emitter electrode EE is electrically connected to the $n^+$ type emitter regions NE1 and NE2 and the plurality of $p^+$ type semiconductor regions PR which are formed in the active cell region LCa via the plurality of connection electrodes CP which are formed in the active cell region LCa. In addition, the emitter electrode EE is electrically connected to the $p^+$ type semiconductor region PR formed in the inactive cell region LCe via the connection electrode CP formed in the inactive cell region LCe. Note that the gate electrode GE (see FIG. 1) which is electrically connected to the trench gate electrodes TG1 and TG2 may be formed at the time of forming the emitter electrode EE.

Note that it is possible to form the gate wiring GL and the gate electrode GE (see FIG. 1) in the gate wiring lead-out region AR2 (see FIG. 2) when the emitter electrode EE is formed in the cell formation region AR1 (see FIG. 2).

Next, as illustrated in FIG. 23, the insulating film FPF serving as the passivation film and made of, for example, an organic film containing polyimide as a major component is formed on the emitter electrode EE. A thickness of the insulating film FPF is, for example, about 2.5 μm.

Next, a resist film (not illustrated) for formation of the opening portion is formed by general lithography. Then, the insulating film FPF is patterned by, for example, dry etching to form an opening portion OP1 (see FIG. 1) which penetrates the insulating film FPF and reaches the emitter electrode EE, and the emitter pad EP (see FIG. 1) formed of a part of the emitter electrode EE exposed to the opening portion OP1 is formed. Thereafter, the resist film for formation of the opening portion which has been no longer needed is removed by ashing or the like.

Note that the insulating film FPF is formed on the gate electrode GE (see FIG. 1) in the gate wiring lead-out region AR2 (see FIG. 1) at the time of forming the insulating film FPF on the emitter electrode EE in the cell formation region AR1 (see FIG. 1). In addition, an opening portion OP2 (see FIG. 1) which penetrates the insulating film FPF and reaches the gate electrode GE is formed in the gate wiring lead-out region AR2 (see FIG. 1) at the time of forming the opening portion OP1 in the cell formation region AR1 (see FIG. 1), and the gate pad GP formed of a part of the gate electrode GE exposed to the opening portion OP2 is formed.

Figure 24:
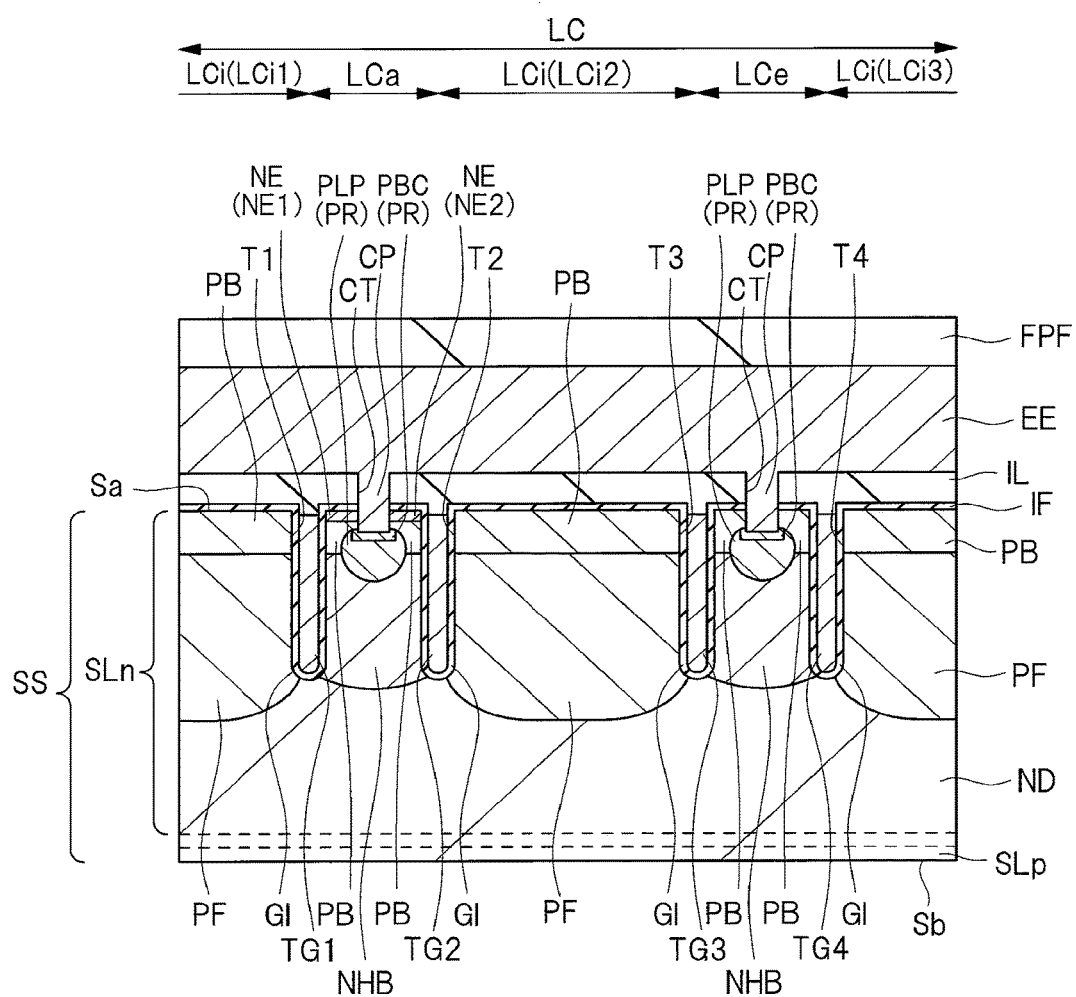
FIG. 24 is a cross-sectional view showing a main part of the manufacturing process of the semiconductor device according to the first embodiment.

Next, as illustrated in FIG. 24, a back grinding process is executed to the lower surface Sb of the semiconductor substrate SS, thereby reducing the thickness of, for example, about 800 μm to, for example, about 30 μm to 200 μm as needed. When the withstand voltage is set to, for example, about 600 V, the final thickness is about 70 μm. In this manner, in the semiconductor substrate SS thus reduced in thickness, the semiconductor layer SLp is formed in a part of the semiconductor substrate SS positioned on a side close to the lower surface Sb relative to the semiconductor layer SLn. In addition, chemical etching or the like is also executed to eliminate damage of the lower surface Sb if necessary.

At this time, in the semiconductor substrate SS thus reduced in thickness, the semiconductor layer on a side close to the lower surface Sb relative to the semiconductor layer in which the n type field stop region Ns (see FIG. 4) is formed, namely, the semiconductor layer in which the $p^+$ type collector region CL (see FIG. 4) is formed is defined as the semiconductor layer SLp.

Next, as illustrated in FIG. 4, the n type impurity is introduced into the lower surface Sb of the semiconductor substrate SS by, for example, ion implantation, thereby forming the n type field stop region Ns. For example, an ion implantation condition in which the ionic species is phosphorus (P), the dose amount is set to about $7 \times 10^{12}$ cm$^{-2}$, and implantation energy is set to about 350 KeV can be shown as a preferable example of the condition of ion implantation at this time. Thereafter, laser annealing or the like is executed to the lower surface Sb of the semiconductor substrate SS to activate the impurity if necessary.

Next, the p type impurity is introduced into the lower surface Sb of the semiconductor substrate SS by, for example, ion implantation, thereby forming the $p^+$ type collector region CL. For example, an ion implantation condition in which the ionic species is boron (B), the dose amount is set to about $1 \times 10^{13}$ cm$^{-2}$, and the implantation energy is set to about 40 KeV can be shown as a preferable example of a condition of the ion implantation at this time. Thereafter, laser annealing or the like is executed to the lower surface Sb of the semiconductor substrate SS to activate the impurity if necessary.

Namely, in the process of forming the $p^+$ type collector region CL, the p type semiconductor layer SLp is formed in a part of the semiconductor substrate SS positioned on a side close to the lower surface Sb relative to the semiconductor layer SLn, and the $p^+$ type collector region CL is formed of the p type semiconductor layer SLp.

Next, the collector electrode CE electrically connected to the semiconductor layer SLp, that is, the $p^+$ type collector region CL is formed on the lower surface Sb of the semiconductor substrate SS by, for example, sputtering. Thereafter, the semiconductor substrate SS is divided into chip regions by dicing or the like, and sealed in a package as needed, thereby completing the semiconductor device according to the first embodiment.

<Characteristics of GG Structure, EGE Structure and GGEE Structure>

Next, characteristics of a GG structure, an EGE structure and a GGEE structure will be described.

Here, the GG structure means a structure of an IGBT having the GG-type active cell region, and the GGEE structure means a structure of an IGBT having the GG-type active cell region and an EE-type inactive cell region. Note that each of the two trench gate electrodes arranged to be spaced apart from each other is electrically connected to the gate electrode in the GG-type active cell region as described above. In addition, each of the two trench gate electrodes arranged to be spaced apart from each other is electrically connected to the emitter electrode in the EE-type inactive cell region.

Meanwhile, though not illustrated, the EGE structure means a structure of an IGBT having an emitter-gate-emitter (EGE) type active cell region. Note that, in the EGE-type active cell region, a trench gate electrode arranged at the center among three trench gate electrodes which are arrayed spaced apart from each other with an interval is electrically connected to a gate electrode, and each of the two trench gate electrodes arranged on both sides is electrically connected to an emitter electrode.

In the GG structure, a p-channel parasitic metal oxide semiconductor field effect transistor (MOSFET) which will be described with reference to FIG. 28 later is not formed and there is no discharge of the carrier, that is, the hole by the parasitic MOSFET, and thus the IE effect is greater than that in the EGE structure and the GGEE structure. However, since the floating region is adjacent to the trench gate electrode which is electrically connected to the gate electrode in the GG structure, the displacement current to the gate electrode is generated along with the variation of potential in the floating region, and there is a risk that a gate voltage varies.

In the EGE structure, the p-channel parasitic MOSFET is formed and the carrier, that is, the hole is easily discharged by the parasitic MOSFET, and it is thus possible to perform the switching operation of turn-off at high speed. In addition, in the EGE structure, the floating region and the trench gate electrode connected to the gate electrode are cut off by the trench gate electrode connected to the emitter electrode, and the displacement current to the gate electrode is less likely to be generated as compared to the GG structure. Further, in the EGE structure, the trench gate electrode connected to the emitter electrode is provided, and it is thus possible to reduce the charge amount Qg to be stored in the gate electrode, and it is possible to perform the switching operation at high speed. However, in the EGE structure, the hole is discharged through the parasitic MOSFET, and thus the IE effect is smaller than that in the GG structure.

In the GGEE structure, the displacement current to the gate electrode easily flows as compared to the EGE structure in which the floating region and the trench gate electrode connected to the gate electrode are cut off by the trench gate electrode connected to the emitter electrode, and the stability thereof is lower than that of the EGE structure. However, in the GGEE structure, the carrier, that is, the hole is easily discharged through the EE-type inactive cell region in which the p-channel parasitic MOSFET is formed, and the variation of the potential in the floating region is suppressed at the switching operation of turn-on, and the generation of the displacement current to the gate electrode is suppressed. In addition, since it is possible to adjust an input capacitance Cies to be high in the GGEE structure, the GGEE structure is advantageous in the case in which the IGBT does not have to have a high switching speed.

<Semiconductor Device of Comparative Example>

Next, a semiconductor device according to a comparative example will be described. The semiconductor device according to the comparative example is also provided with an IGBT including a GG-type active cell region and an EE-type inactive cell region like the semiconductor device according to the first embodiment.

Figure 25:
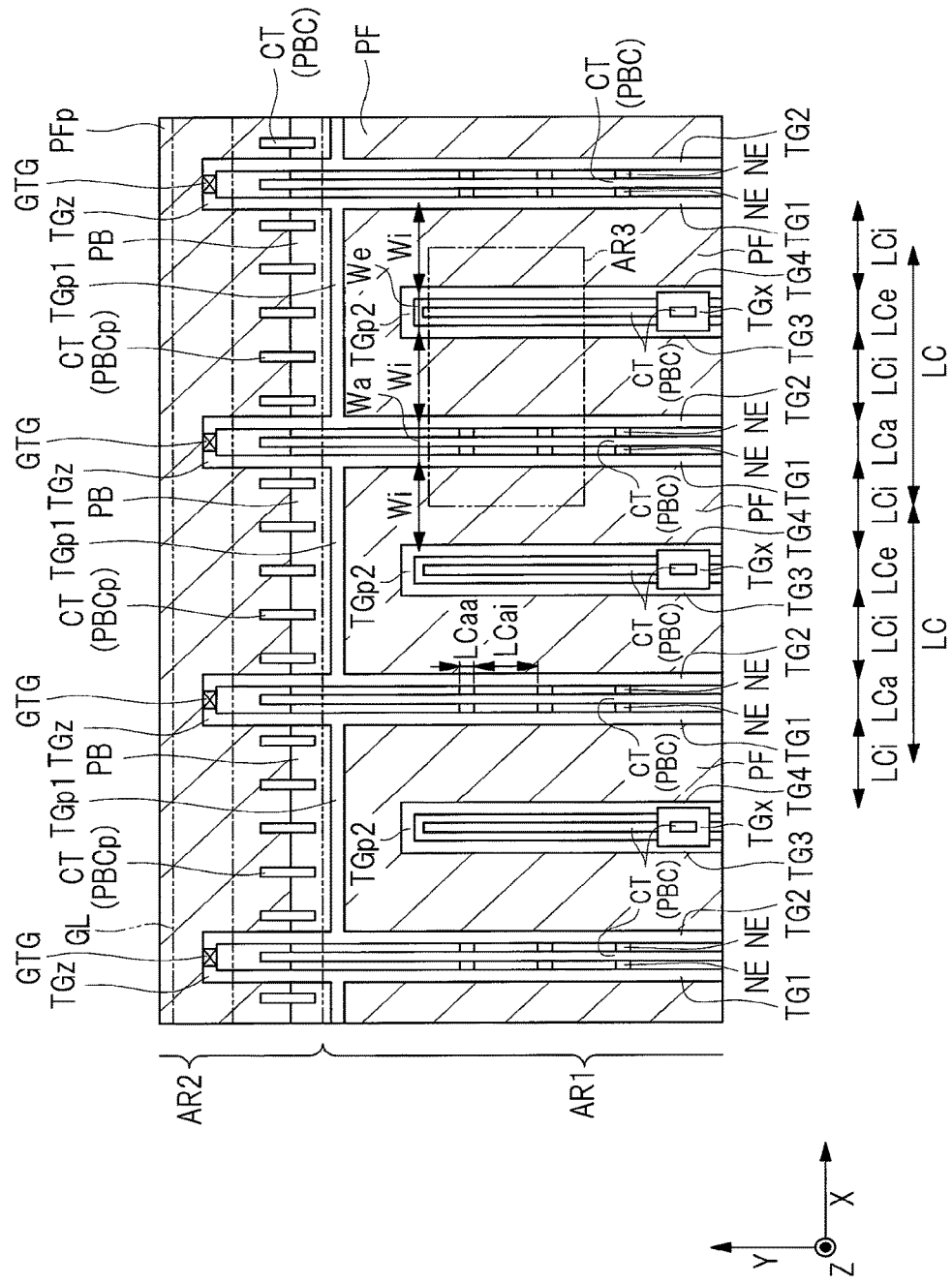
FIG. 25 is a plan view showing a main part of a semiconductor device according to a comparative example.
Figure 26:
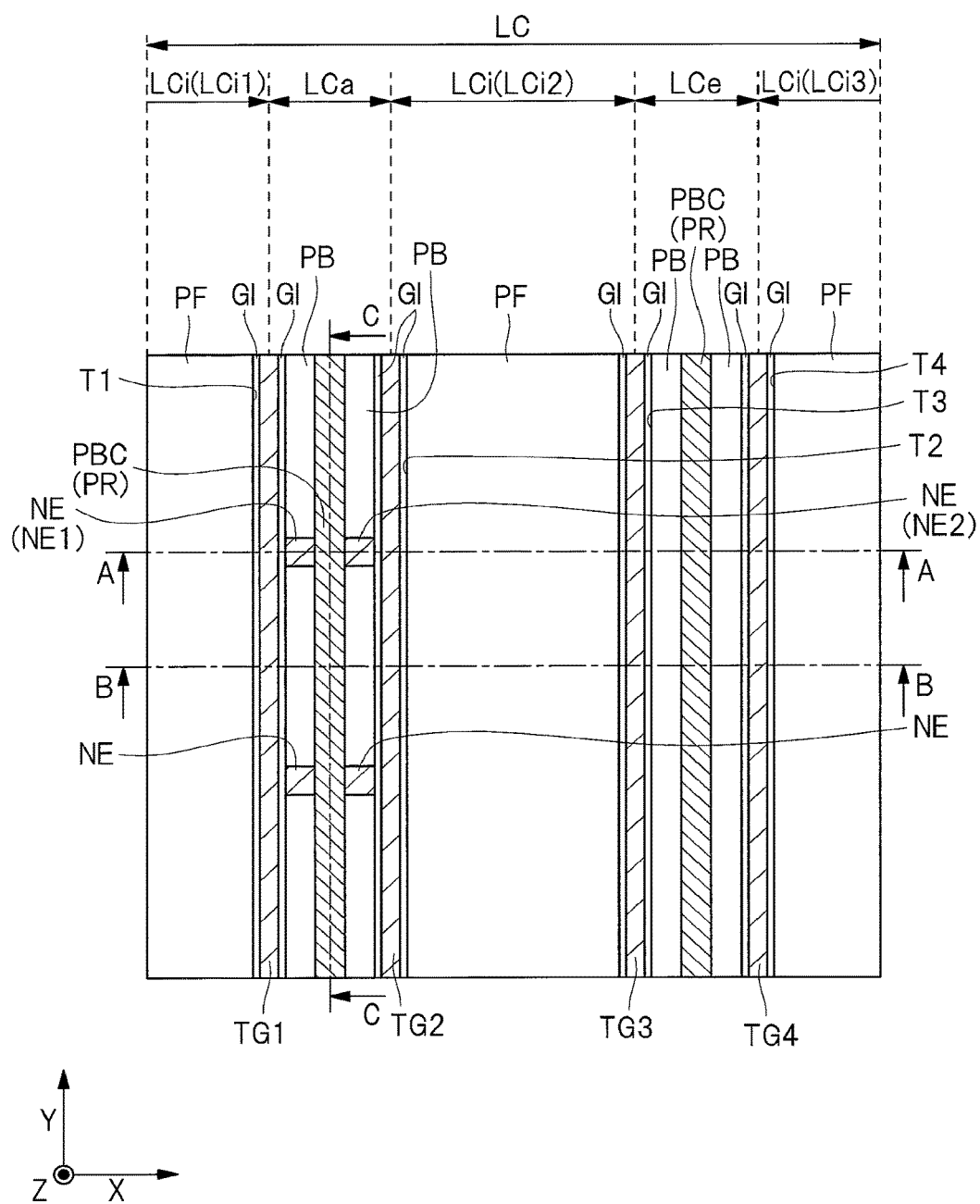
FIG. 26 is a plan view showing a main part of the semiconductor device according to the comparative example.
Figure 27:
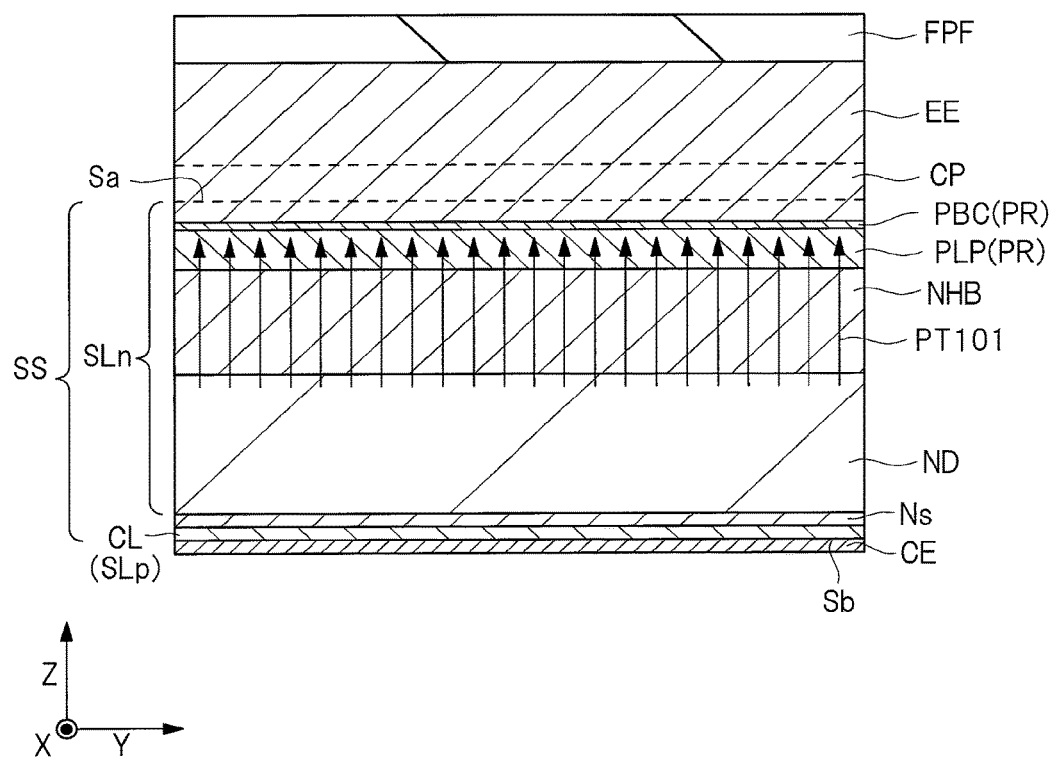
FIG. 27 is a cross-sectional view showing a main part of the semiconductor device according to the comparative example.

FIGS. 25 and 26 are plan views showing main parts of the semiconductor device according to the comparative example. FIG. is a cross-sectional view showing the main part of the semiconductor device according to the comparative example. FIG. 27 corresponds to the cross-sectional view taken along the line C-C of FIG. 26. Note that a cross-sectional view taken along the line A-A of FIG. 26 is the same as the cross-sectional view illustrated in FIG. 4. In addition, a cross-sectional view taken along the line B-B of FIG. 26 is the same as the cross-sectional view illustrated in FIG. 4 except that the $n^+$ type emitter region NE is not provided.

In the semiconductor device according to the comparative example, each of the unit cell regions LC includes the active cell region LCa serving as the GG-type active cell region, the inactive cell region LCe serving as the EE-type inactive cell region, and the three inactive cell regions LCi like the semiconductor device according to the first embodiment. In addition, in the semiconductor device according to the comparative example, the plurality of $n^+$ type emitter regions NE are formed in the active cell region LCa like the semiconductor device according to the first embodiment.

On the other hand, in the comparative example, the $p^+$ type semiconductor region PR is continuously formed along the Y-axis direction in the active cell region LCa unlike the first embodiment. In addition, the contact trench CT serving as the opening portion is continuously formed along the Y-axis direction in the p type body region PB in the active cell region LCa. The contact trench CT reaches the $p^+$ type body contact region PBC arranged in the active cell region LCa.

Note that, in the comparative example, the $p^+$ type semiconductor region PR is continuously formed along the Y-axis direction in the inactive cell region LCe like the first embodiment. The contact trench CT reaches the $p^+$ type body contact region PBC arranged in the inactive cell region LCe.

Figure 28:
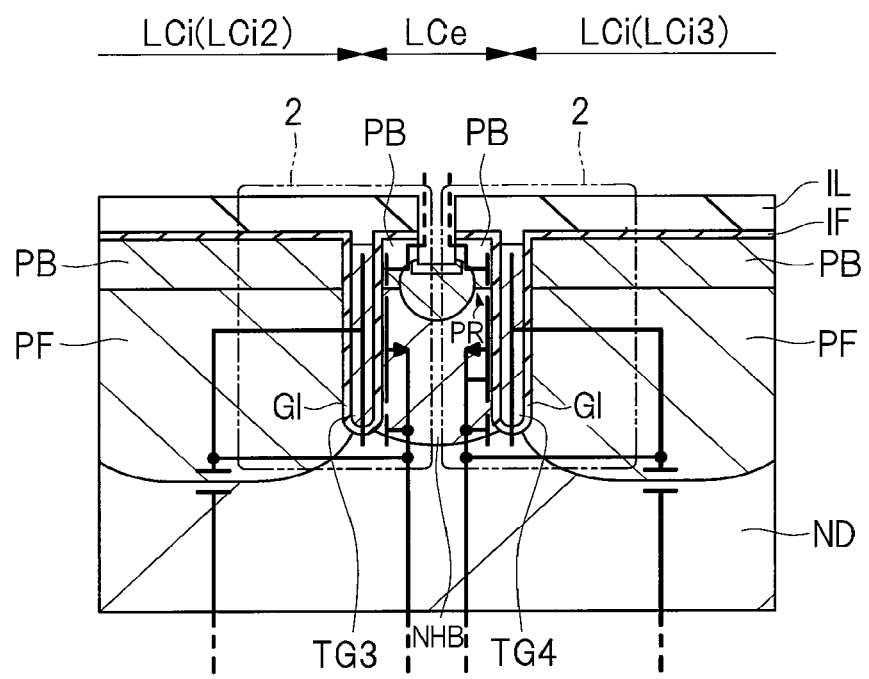
FIG. 28 is a cross-sectional view of a p channel parasitic MOSFET in the semiconductor device according to the comparative example.

FIG. 28 is a cross-sectional view illustrating the p-channel parasitic MOSFET in the semiconductor device according to the comparative example.

As illustrated in FIG. 28, in the semiconductor device according to the comparative example, a p-channel parasitic MOSFET 2 is formed in the EE-type inactive cell region LCe. Note that the same goes for the case in which a parasitic metal insulator semiconductor field effect transistor (MISFET) formed of various types of MISFETs other than MOSFET is provided as the parasitic MOSFET.

As described above, in the GGEE structure including the GG-type active cell region and the EE-type inactive cell region, the carrier, that is, the hole is easily discharged through the EE-type inactive cell region, and the variation of the potential in the floating region at the switching operation of turn-on is suppressed, so that the generation of the displacement current to the gate electrode is suppressed.

Namely, in the semiconductor device according to the comparative example, the carriers are stored in the on-state in order to improve the IE effect in the GG-type active cell region LCa, and the semiconductor device according to the comparative example includes the EE-type inactive cell region LCe in addition to the GG-type active cell region LCa in order that the carriers stored in the on-state are easily discharged at the time of turn-off. In other words, the EE-type inactive cell region LCe is provided to facilitate the discharge of the carriers, which are stored in the on-state, at the time of turn-off.

At the time of turn-off of the L-load switching, first, the voltage VCE as the collector-emitter voltage increases in accordance with the turn-off. At this time, the channel region of the p-channel parasitic MOSFET 2 is inverted to the p type. Then, the holes serving as the carriers stored in the p type floating region PF and the $n^-$ type drift region ND are discharged through the p-channel parasitic MOSFET 2. The stored holes are rapidly discharged by the operation described above, and thus the carriers stored in the on-state are easily discharged at the time of turn-off in the semiconductor device according to the comparative example as compared to the semiconductor device in which the EE-type inactive cell region LCe is not provided.

However, in the case in which the inactive cell region LCe is provided, there is a risk that the IE effect is suppressed in the on-state as compared to the case in which the inactive cell region LCe is not provided, and there is a risk that the on-voltage increases.

In addition, in the case in which the EE-type inactive cell region LCe is provided, the holes stored in the $n^-$ type drift region ND are easily discharged at the time of turn-on of the L-load switching through the p-channel parasitic MOSFET 2 provided in the EE-type inactive cell region LCe as compared to the case in which the EE-type inactive cell region LCe is not provided. Thus, there is a risk that the IE effect is suppressed at the time of turn-on of the L-load switching in the semiconductor device according to the comparative example as compared to the case in which the EE-type inactive cell region LCe is not provided, and there is a risk that the switching loss increases.

As illustrated in FIGS. 26 and 27, in the semiconductor device according to the comparative example, the $p^+$ type body contact region PBC is continuously formed in the Y-axis direction when seen in a plan view in the GG-type active cell region LCa and the $p^+$ type body contact region PBC arranged at any position in the Y-axis direction is also in contact with the emitter electrode EE. Thus, in the semiconductor device according to the comparative example, the p type body region PB arranged at any position in the Y-axis direction is electrically connected to the emitter electrode EE via the $p^+$ type body contact region PBC formed thereon. Accordingly, as illustrated by a path PT101 of FIG. 27, the holes are discharged to the emitter electrode EE also through the $n^-$ type drift region ND arranged at any position in the Y-axis direction in the GG-type active cell region LCa in the semiconductor device according to the comparative example.

Also in this case, the IE effect is suppressed in the on-state and the on-voltage increases as compared to the case in which the EE-type inactive cell region LCe is not provided. In addition, the IE effect is suppressed at the time of turn-on of the L-load switching and the switching loss increases as compared to the case in which the EE-type inactive cell region LCe is not provided.

<Main Characteristics and Effects of Present Embodiment>

The EE-type inactive cell region LCe in the first embodiment is the same as the EE-type inactive cell region LCe in the comparative example, and thus the parasitic MOSFET illustrated in FIG. 28 is provided also in the semiconductor device according to the first embodiment. From this point of view, it is possible to consider that the IE effect is likely to be suppressed in the on-state and at the time of turn-on of the L-load switching also in the semiconductor device according to the first embodiment as compared to the case in which the EE-type inactive cell region LCe is not provided.

However, in the semiconductor device according to the first embodiment, the plurality of $p^+$ type body contact regions PBC are arranged to be spaced apart from each other along the Y-axis direction in the GG-type active cell region LCa when seen in a plan view. Further, the plurality of $p^+$ type body contact regions PBC arranged to be spaced apart from each other are in contact with the emitter electrode EE.

Thus, in the semiconductor device according to the first embodiment, the p type body region PB arranged at all the positions in the Y-axis direction is not necessarily electrically connected to the emitter electrode EE via the $p^+$ type body contact region PBC. Namely, in the semiconductor device according to the first embodiment, the holes are discharged to the emitter electrode EE only through a part of the $n^-$ type drift region ND in the GG-type active cell region LCa as illustrated by a path PT1 of FIG. 6.

Accordingly, in the semiconductor device according to the first embodiment, it is possible to prevent the IE effect from being suppressed in the on-state and to prevent the increase of the on-voltage as compared to the semiconductor device according to the comparative example. In addition, in the semiconductor device according to the first embodiment, it is possible to prevent the IE effect from being suppressed at the time of turn-on of the L-load switching and to prevent the increase of the switching loss as compared to the semiconductor device according to the comparative example.

Namely, the discharge amount of the holes stored in the $n^-$ type drift region ND to be discharged from the GG-type active cell region LCa is suppressed in the first embodiment. Accordingly, it is possible to adjust the discharge amount of the holes stored in the $n^-$ type drift region ND at the time of being discharged through the p-channel parasitic MOSFET 2 provided in the EE-type inactive cell region LCe at the time of the L-load switching. Further, in the first embodiment, it is possible to prevent both the increase of the on-voltage and the increase of the switching loss at the time of turn-on of the L-load switching, which are the problems in the case in which the EE-type inactive cell region LCe is provided. In other words, the IE effect in which the carriers are stored in the $n^-$ type drift region ND is improved in the first embodiment by suppressing the discharge amount of the holes stored in the $n^-$ type drift region ND to be discharged from the GG-type active cell region LCa. Thus, in the first embodiment, it is possible to prevent both the increase of the on-voltage and the increase of the switching loss at the time of turn-on of the L-load switching while facilitating the discharge of the carriers even at the time of turn-off.

Note that the conductivity type of each semiconductor region may be collectively changed to an opposite conductivity type in the first embodiment (the same is true of the modified example and the second embodiment below).

<Modified Example of Semiconductor Device of First Embodiment>

In the semiconductor device according to the first embodiment, the n type hole barrier region NHB serving as the n type semiconductor region is formed below the p type body region PB in the GG-type active cell region LCa, and the n type hole barrier region NHB serving as the n type semiconductor region is formed below the p type body region PB in the EE-type inactive cell region LCe.

Meanwhile, the n type impurity concentration of the n type hole barrier region NHB formed in the EE-type inactive cell region LCe may be lower than the n type impurity concentration of the n type hole barrier region NHB formed in the GG-type active cell region LCa. Such an example will be described as the modified example of the semiconductor device according to the first embodiment.

Figure 29:
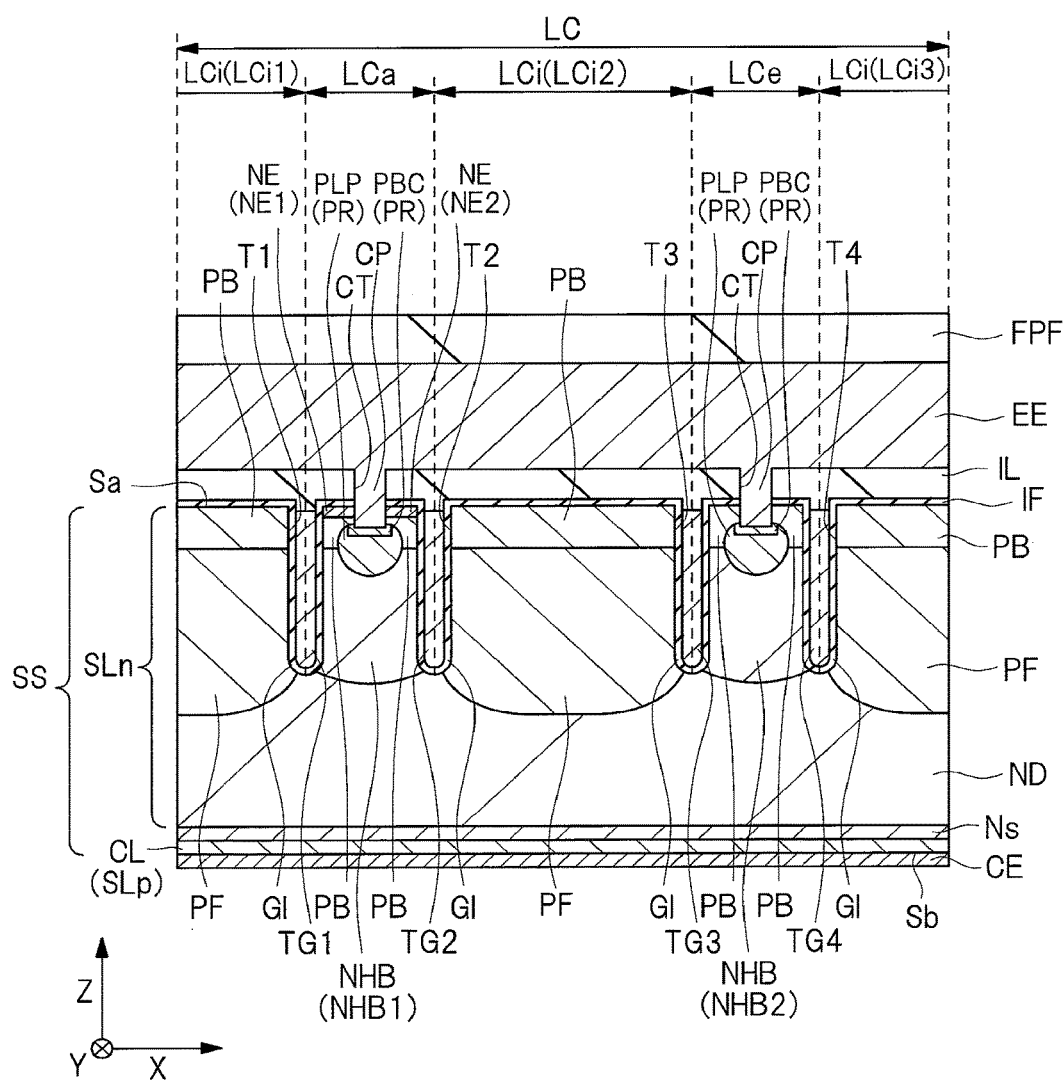
FIG. 29 is a cross-sectional view showing a main part of a semiconductor device according to a modified example of the first embodiment.

FIG. 29 is a cross-sectional view showing the main part of a semiconductor device according to the modified example of the first embodiment. Note that a plan view showing the main part of the semiconductor device according to the modified example of the first embodiment is the same as the plan view showing the main part illustrated in FIG. 3, and thus, FIG. 29 is the cross-sectional view taken along the line A-A of FIG. 3.

The semiconductor device according to the modified example has the same structure as the semiconductor device according to the first embodiment except that the n type impurity concentration of the n type hole barrier region NHB formed in the EE-type inactive cell region LCe is lower than the n type impurity concentration of the n type hole barrier region NHB formed in the GG-type active cell region LCa. Thus, the semiconductor device according to the modified example has the same effect as that of the semiconductor device according to the first embodiment.

As illustrated in FIG. 29, also in the modified example, the n type hole barrier region NHB serving as the n type semiconductor region is formed below the p type body region PB in each of the active cell region LCa and the inactive cell region LCe like the first embodiment.

The n type impurity concentration of the n type hole barrier region NHB formed in the active cell region LCa is higher than the n type impurity concentration of a part of the semiconductor layer SLn (n⁻ type drift region ND) positioned on a side close to the lower surface Sb relative to the n type hole barrier region NHB. Further, the n type impurity concentration of the n type hole barrier region NHB formed in the active cell region LCa is lower than the n type impurity concentration of the n⁺ type emitter region NE.

In addition, the n type impurity concentration of the n type hole barrier region NHB formed in the inactive cell region LCe is higher than the n type impurity concentration of a part of the semiconductor layer SLn (n⁻ type drift region ND) positioned on a side close to the lower surface Sb relative to the corresponding n type hole barrier region NHB. Further, the n type impurity concentration of the n type hole barrier region NHB formed in the inactive cell region LCe is lower than the n type impurity concentration of the n⁺ type emitter region NE formed in the active cell region LCa.

Meanwhile, in the modified example, an n type impurity concentration of an n type hole barrier region NHB2 serving as the n type hole barrier region NHB formed in the inactive cell region LCe is lower than an n type impurity concentration of an n type hole barrier region NHB1 serving as the n type hole barrier region NHB formed in the active cell region LCa unlike the first embodiment.

In the modified example, the n type impurity concentration of the n type hole barrier region NHB2 is made lower than the n type impurity concentration of the n type hole barrier region NHB1 in order to improve the discharge effect in which the holes as the carriers stored in the n⁻ type drift region ND or the like are discharged through the p-channel parasitic MOSFET 2 (see FIG. 28). In this manner, it is possible to reduce an absolute value of a threshold voltage Vth of the p-channel parasitic MOSFET 2 formed in the inactive cell region LCe. Thus, the p-channel parasitic MOSFET 2 is easily turned into the on-state, and it is possible to improve the discharge effect in which the holes stored in the n⁻ type drift region ND or the like are discharged through the p-channel parasitic MOSFET 2.

Accordingly, the discharge amount of holes as carriers to be discharged in the EE-type inactive cell region LCe at the time of turn-off of the L-load switching becomes larger than the discharge amount of holes as carriers to be discharged in the GG-type active cell region LCa. In addition, in the modified example, the n⁺ type emitter region NE is not formed and a parasitic bipolar transistor formed of an npn bipolar transistor is not formed in the inactive cell region LCe. Thus, latch-up becomes hard to occur in the inactive cell region LCe in the semiconductor device according to the modified example, and thus, it is possible to improve breakdown tolerance such as the reverse bias safe operating area (RBSOA) tolerance as compared to the semiconductor device according to the first embodiment.

Note that then type hole barrier region NHB is not necessarily formed in the EE-type inactive cell region LCe. At this time, in apart of the semiconductor layer SLn positioned between the trench T3 and the trench T4 and below the p type body region PB, the n type hole barrier region NHB is not formed, but the n⁻ type drift region ND is formed. Even in this case, the same effect as the example which has been described with reference to FIG. 29 is obtained in the case in which the n type hole barrier region NHB is formed in the GG-type active cell region LCa.

In addition, the manufacturing method of the semiconductor device according to the modified example can be the same as the manufacturing method of the semiconductor device according to the first embodiment except that the n type impurity concentration of the n type hole barrier region NHB2 is made lower than the n type impurity concentration of the n type hole barrier region NHB1 or the n type hole barrier region is not formed in the inactive cell region LCe.

Second Embodiment

In the second embodiment, an example of a module in which a plurality of semiconductor chips each having an IGBT including a GG-type active cell region and an EE-type inactive cell region are provided and the plurality of semiconductor chips are connected in parallel to each other will be described.

Figure 30:
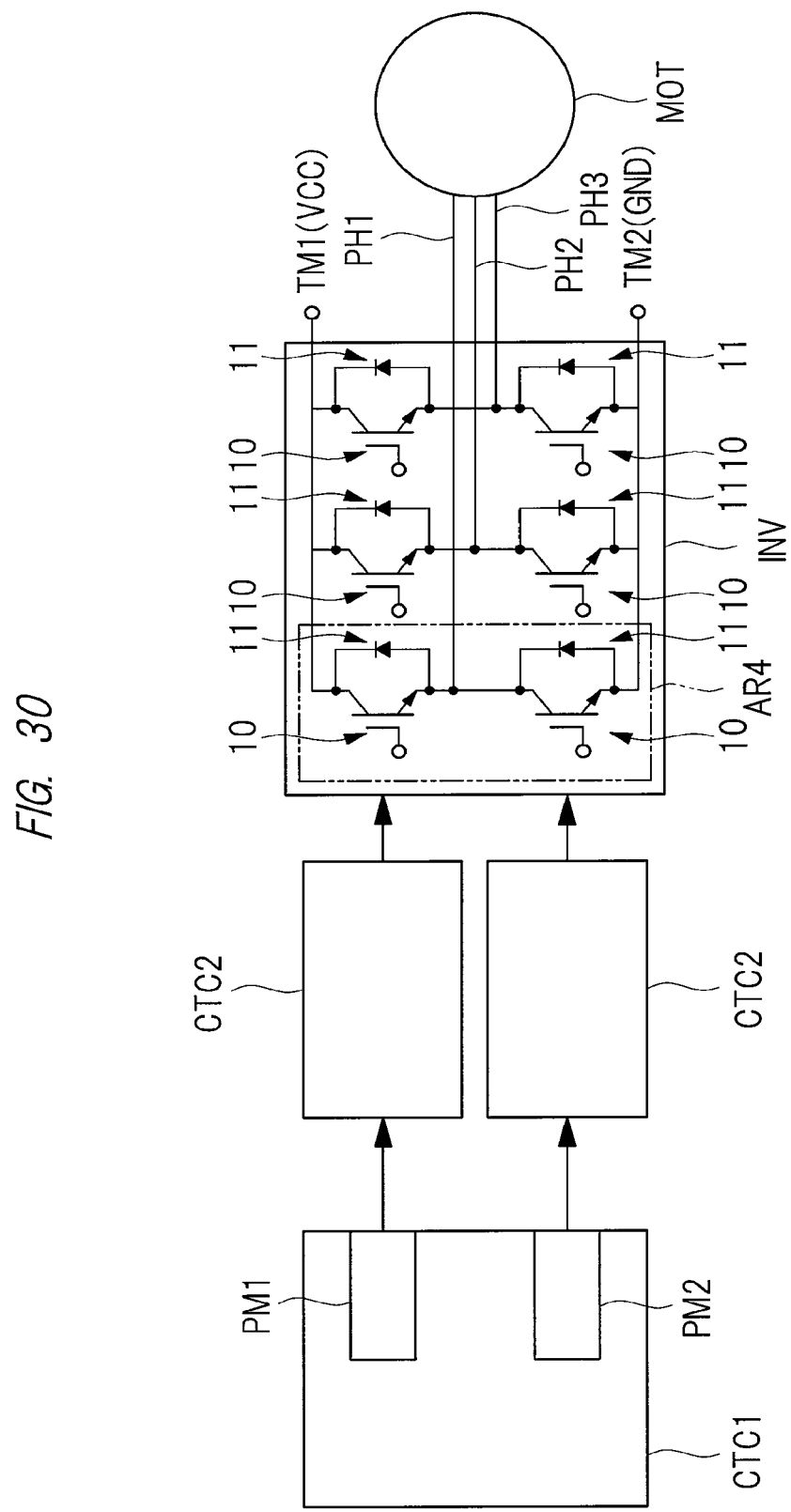
FIG. 30 is a circuit block diagram showing an example of an electronic system in which a semiconductor device according to the second embodiment is used.
Figure 31:
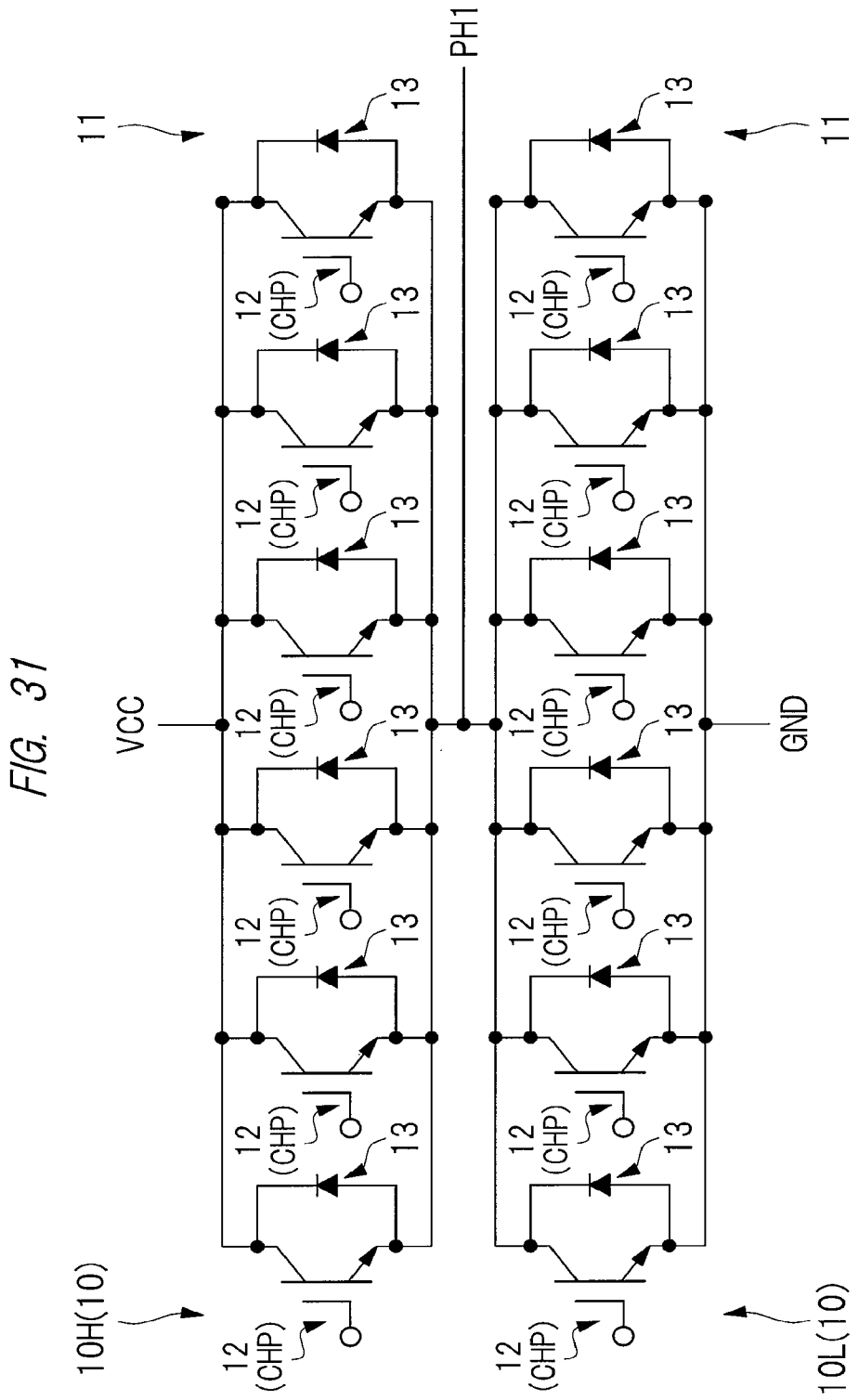
FIG. 31 is an equivalent circuit diagram showing a module as the semiconductor device according to the second embodiment.

FIG. 30 is a circuit block diagram illustrating an example of an electronic system in which a semiconductor device according to the second embodiment is used. FIG. 31 is an equivalent circuit diagram illustrating the module serving as the semiconductor device according to the second embodiment. FIG. 31 illustrates two IGBT modules 10 which correspond to a U phase PH1 among six IGBT modules 10 included in an inverter INV illustrated in FIG. 30.

As illustrated in FIG. 30, the electronic system in which the semiconductor device according to the second embodiment is used includes a load such as a motor MOT, the inverter INV, a control circuit CTC1 and a control circuit CTC2. The electronic system like this is, for example, a solar power generation system or a wind power generation system. Here, a three-phase motor is used as the motor MOT. The three-phase motor is configured to be driven by three-phase voltages having different phases. The control circuit CTC1 includes a plurality of power modules PM1 and PM2.

In the electronic system illustrated in FIG. 30, for example, output of a power generation module (not illustrated) in the solar power generation system or the wind power generation system is connected to input terminals TM1 and TM2 of the inverter INV, and a DC voltage, that is, a DC power of the corresponding power generation module is supplied to the inverter INV.

The control circuit CTC1 is configured of, for example, an electronic control unit (ECU) and incorporates a semiconductor chip for control such as a micro controller unit (MCU). The control circuit CTC1 includes a plurality of power modules PM1 and PM2. The power modules PM1 and PM2 are also configured of, for example, the ECU and incorporates a semiconductor chip for control such as the MCU.

The plurality of power modules PM1 and PM2 included in the control circuit CTC1 are connected to the control circuit CTC2. The inverter INV is controlled by the control circuit CTC2. Although not illustrated, the control circuit CTC2 includes, for example, a gate driver and a photo coupler. The gate driver (not illustrated) included in the control circuit CTC2 is connected to the inverter INV. At this time, the gate driver (not illustrated) included in the control circuit CTC2 is connected to a gate electrode of the IGBT provided in the inverter INV.

The motor MOT is connected to the inverter INV, and the DC voltage, that is, the DC power which has been supplied to the inverter INV from the power generation module (not illustrated) in the solar power generation system or the wind power generation system, for example, is converted into an AC voltage, that is, an AC power in the inverter INV, and is then supplied to the motor MOT. The motor MOT is controlled by the AC voltage, that is, the AC power supplied from the inverter INV.

In the example illustrated in FIG. 30, the motor MOT is the three-phase motor including the U phase PH1, a V phase PH2 and a W phase PH3. Thus, the inverter INV also corresponds to the three phases including the U phase PH1, the V phase PH2 and the W phase PH3. The inverter INV corresponding to the three phases in this manner includes six sets of the IGBT module 10 and a diode module 11.

The semiconductor device according to the second embodiment corresponds to the IGBT module 10. In addition, the IGBT module 10 includes a plurality of IGBT chips 12, and the IGBT chip 12 corresponds to the semiconductor chip CHP (see FIG. 1).

Note that, when the motor MOT is a two-phase motor, the inverter INV includes four sets of the IGBT module 10 and the diode module 11.

A side close to a power supply potential VCC in the inverter INV relative to the input potential of the motor MOT is referred to as a high side. Also, a side close to a ground potential GND in the inverter INV relative to the input potential of the motor MOT is referred to as a low side. In the example illustrated in FIG. 30, the three IGBT modules 10 are used as the IGBT modules 10 on the high side, and the three IGBT modules 10 are used as the IGBT modules 10 on the low side. Further, the three diode modules 11 are used as the diode modules 11 on the high side, and the three diode modules 11 are used as the diode modules 11 on the low side.

For example, the high-side IGBT module 10H of the two IGBT modules 10 corresponding to the U phase illustrated in a region AR4 of FIG. 30 is provided with a plurality of (for example, six) IGBT chips 12 formed of the semiconductor chips CHP as illustrated in FIG. 31. In addition, the low-side IGBT module 10L of the two IGBT modules 10 corresponding to the U phase is provided with a plurality of (for example, six) IGBT chips 12 formed of the semiconductor chips CHP. On both the high side and the low side, the respective emitter electrodes EE of the plurality of IGBT chips 12 are electrically connected to each other, and the respective collector electrodes CE of the plurality of IGBT chips 12 are electrically connected to each other.

The semiconductor device according to the first embodiment illustrated in FIGS. 1 to 6 can be used as each of the plurality of IGBT chips 12 included in the IGBT module 10.

In the example illustrated in FIG. 30, the IGBT module 10 and the diode module 11 are connected in reverse parallel between the power supply potential VCC supplied to the inverter INV via the input terminals TM1 and TM2 and the input potential of the motor MOT, that is, on the high side at each of the three phases including the U phase PH1, the V phase PH2 and the W phase PH3. In addition, the IGBT module 10 and the diode module 11 are connected in reverse parallel between the input potential of the motor MOT and the ground potential GND, that is, on the low side at each of the three phases including the U phase PH1, the V phase PH2 and the W phase PH3.

Further, the control circuit CTC2 is connected to the respective gate electrodes of the plurality of IGBT chips 12 included in each of the six IGBT modules 10, and each of the plurality of IGBT chips 12 included in the six IGBT modules 10 is controlled by the control circuit CTC2. Note that each of the six diode modules 11 includes a plurality of diodes 13, and each of the IGBT chips 12 and each of the diodes 13 are connected in reverse parallel.

By controlling the current flowing in the respective IGBT modules 10 by the control circuit CTC2, the motor MOT is driven and rotated. Namely, it is possible to drive the motor MOT by controlling the turning on and off of the respective IGBT modules 10 by the control circuit CTC2. When the motor MOT is driven in this manner, it is necessary to turn on and off the IGBT module 10, but the motor MOT includes inductance. Accordingly, when the IGBT module 10 is turned off, the reverse current in a direction reverse to the direction in which the current of the IGBT module 10 flows is generated due to the inductance included in the motor MOT. Since the IGBT module 10 does not have a function to cause the reverse current to flow, the reverse current is circulated to release the energy to be stored in the inductance by providing the diode module 11 to be in reverse parallel with the IGBT module 10.

<Main Characteristics and Effects of Present Embodiment>

As described above, it is possible to use the semiconductor device according to the first embodiment illustrated in FIGS. 1 to 6 as each of the plurality of IGBT chips 12 included in the IGBT module 10 which is the module of the second embodiment.

Thus, like the first embodiment, it is possible to prevent the IE effect from being suppressed in the on-state and to prevent the increase of the on-voltage also in the plurality of IGBT chips 12 included in the module of the second embodiment as compared to the case in which the EE-type inactive cell region LCe is not provided. In addition, like the first embodiment, it is possible to prevent the IE effect from being suppressed at the time of turn-on of the L-load switching and to prevent the increase of the switching loss also in the plurality of IGBT chips 12 included in the module of the second embodiment as compared to the case in which the EE-type inactive cell region LCe is not provided.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:
a semiconductor substrate having a first main surface and a second main surface on an opposite side of the first main surface;
a first semiconductor layer of a first conductivity type formed in the semiconductor substrate;
a second semiconductor layer of a second conductivity type different from the first conductivity type formed in the semiconductor substrate positioned on a side close to the second main surface relative to the first semiconductor layer;
a first trench portion which is formed in the first semiconductor layer from the first main surface and extends in a first direction when seen in a plan view;
a second trench portion which is formed in the first semiconductor layer from the first main surface, is arranged to be spaced apart from the first trench portion, and extends in the first direction;
a third trench portion which is formed in the first semiconductor layer from the first main surface, is arranged on an opposite side of the first trench portion with the second trench portion interposed therebetween, and extends in the first direction;
a fourth trench portion which is formed in the first semiconductor layer from the first main surface, is arranged on an opposite side of the second trench portion with the third trench portion interposed therebetween, and extends in the first direction;
a first insulating film formed on an inner wall of the first trench portion;
a second insulating film formed on an inner wall of the second trench portion;
a third insulating film formed on an inner wall of the third trench portion;
a fourth insulating film formed on an inner wall of the fourth trench portion;
a first trench electrode which is formed on the first insulating film so as to fill the first trench portion;
a second trench electrode which is formed on the second insulating film so as to fill the second trench portion;
a third trench electrode which is formed on the third insulating film so as to fill the third trench portion;
a fourth trench electrode which is formed on the fourth insulating film so as to fill the fourth trench portion;
a first semiconductor region of the second conductivity type which is formed in the first semiconductor layer positioned between the first trench portion and the second trench portion and is in contact with the first insulating film and the second insulating film;
a second semiconductor region of the second conductivity type which is formed in the first semiconductor layer positioned between the third trench portion and the fourth trench portion and is in contact with the third insulating film and the fourth insulating film;
a third semiconductor region of the first conductivity type which is formed in the first semiconductor region positioned between the first trench portion and the second trench portion and is contact with the first insulating film;
a fourth semiconductor region of the first conductivity type which is formed in the first semiconductor region positioned between the first trench portion and the second trench portion and is contact with the second insulating film;
a fifth semiconductor region of the second conductivity type which is formed in the first semiconductor layer positioned on an opposite side of the second trench portion with the first trench portion interposed therebetween;
a sixth semiconductor region of the second conductivity type which is formed in the first semiconductor layer positioned between the second trench portion and the third trench portion;
a seventh semiconductor region of the second conductivity type which is formed in the first semiconductor layer positioned on an opposite side of the third trench portion with the fourth trench portion interposed therebetween;
eighth semiconductor regions of the second conductivity type each of which is formed in the first semiconductor layer positioned between the first trench portion and the second trench portion and is in contact with the first semiconductor region;
a ninth semiconductor region of the second conductivity type which is formed in the first semiconductor layer positioned between the third trench portion and the fourth trench portion and is in contact with the second semiconductor region;
an emitter electrode which is electrically connected to the third semiconductor region, the fourth semiconductor region, the eighth semiconductor regions, the ninth semiconductor region, the third trench electrode, and the fourth trench electrode;
a collector electrode which is electrically connected to the second semiconductor layer; and
a gate electrode which is electrically connected to the first trench electrode and the second trench electrode,
wherein an impurity concentration of the second conductivity type of each of the eighth semiconductor regions is higher than an impurity concentration of the second conductivity type of the first semiconductor region,
an impurity concentration of the second conductivity type of the ninth semiconductor region is higher than an impurity concentration of the second conductivity type of the second semiconductor region,
the eighth semiconductor regions are arranged to be spaced apart from each other along the first direction, and
the ninth semiconductor region is continuously formed along the first direction.

2. The semiconductor device according to claim 1,
wherein a semiconductor region of the first conductivity type is not formed in the second semiconductor region.

3. The semiconductor device according to claim 1,
wherein the first trench portion and the second trench portion are formed in a first region of the semiconductor substrate,
the third trench portion and the fourth trench portion are formed in a second region of the semiconductor substrate,
an insulated gate bipolar transistor is formed of the first trench electrode, the second trench electrode, the first insulating film, the second insulating film, the first semiconductor region, the third semiconductor region, and the fourth semiconductor region in the first region, and no insulated gate bipolar transistor is formed in the second region.

4. The semiconductor device according to claim 1, further comprising:
- a tenth semiconductor region of the first conductivity type which is formed in the first semiconductor layer positioned between the first trench portion and the second trench portion; and
- an eleventh semiconductor region of the first conductivity type which is formed in the first semiconductor layer positioned between the third trench portion and the fourth trench portion,
- wherein the tenth semiconductor region is arranged on the second main surface side relative to the first semiconductor region,
- the eleventh semiconductor region is arranged on the second main surface side relative to the second semiconductor region,
- an impurity concentration of the first conductivity type of the tenth semiconductor region is higher than an impurity concentration of the first conductivity type of the first semiconductor layer, and is lower than an impurity concentration of the first conductivity type of the third semiconductor region or the fourth semiconductor region, and
- an impurity concentration of the first conductivity type of the eleventh semiconductor region is higher than an impurity concentration of the first conductivity type of the first semiconductor layer, and is lower than the impurity concentration of the first conductivity type of the tenth semiconductor region.

5. The semiconductor device according to claim 1, further comprising:
- a fifth insulating film which covers the first semiconductor region and the second semiconductor region;
- first opening portions each of which penetrates the fifth insulating film and reaches the middle of the first semiconductor region;
- a second opening portion which penetrates the fifth insulating film and reaches a middle of the second semiconductor region;
- first connection electrodes each of which is embedded in each of the first opening portions; and
- a second connection electrode which is embedded in the second opening portion,
- wherein the first opening portions are arranged to be spaced apart from each other along the first direction when seen in a plan view,
- the second opening portion is continuously formed along the first direction when seen in a plan view,
- each of the eighth semiconductor regions is formed in the first semiconductor region exposed to the first opening portions,
- the ninth semiconductor region is formed in the second semiconductor region exposed to the second opening portion, and
- the emitter electrode is electrically connected to the third semiconductor region, the fourth semiconductor region, and the eighth semiconductor regions via the first connection electrodes, and is electrically connected to the ninth semiconductor region via the second connection electrode.

6. The semiconductor device according to claim 1, further comprising:
- a plurality of the third semiconductor regions; and
- a plurality of the fourth semiconductor regions,
- wherein each of the plurality of third semiconductor regions is arranged at the same position as each of the eighth semiconductor regions in the first direction, and
- each of the plurality of fourth semiconductor regions is arranged at the same position as each of the eighth semiconductor regions in the first direction.

7. The semiconductor device according to claim 1,
wherein the collector electrode is formed on the second main surface of the semiconductor substrate.

8. The semiconductor device according to claim 1,
wherein a depth from the first main surface of the fifth semiconductor region is deeper than a depth from the first main surface of the first trench portion,
a depth from the first main surface of the sixth semiconductor region is deeper than a depth from the first main surface of the third trench portion,
a depth from the first main surface of the seventh semiconductor region from the first main surface is deeper than a depth from the first main surface of the fourth trench portion.

9. The semiconductor device according to claim 1,
wherein a depth from the first main surface of the first trench portion and the second trench portion is larger than a depth from the main surface of first semiconductor region, and
wherein a depth from the first main surface of the third trench portion and the fourth trench portion is larger than a depth from the first main surface of second semiconductor region.

\* \* \* \* \*